United States Patent

Akiyama

[11] Patent Number: 6,049,095
[45] Date of Patent: Apr. 11, 2000

[54] SEMICONDUCTOR DEVICE

[75] Inventor: Hajime Akiyama, Hyogo, Japan

[73] Assignee: Mitsubishi Denki Kabushiki Kaisha, Tokyo, Japan

[21] Appl. No.: 08/895,982

[22] Filed: Jul. 17, 1997

[30] Foreign Application Priority Data

Feb. 19, 1997 [JP] Japan .................................. 9-034818

[51] Int. Cl.[7] ..................... H01L 29/74; H01L 31/111; H01L 29/76
[52] U.S. Cl. ..................... 257/141; 257/162; 257/343
[58] Field of Search .................. 257/139, 141, 257/162, 343

[56] References Cited

U.S. PATENT DOCUMENTS

| 5,294,824 | 3/1994 | Okada | 257/343 |
| 5,428,241 | 6/1995 | Terashima | 257/343 |

FOREIGN PATENT DOCUMENTS 4-2169  1/1992  Japan .

OTHER PUBLICATIONS

"A Versatile 700–1200–V IC Process for Analog and Switching Applications". A.W. Ludikhuize, IEEE Transactions on Electron Devices, vol. 38. No. 7 Jul. 1991, pp. 1582–1589.

"Numerical Predictions of p–channel SOI LIGBT Electrical Characteristics". Funaki et al., Proceedings of 1995 International Symposium on Power Semiconductor Devices & ICs, Yokohama, pp. 350–353.

Primary Examiner—Wael M. Fahmy
Attorney, Agent, or Firm—McDermott, Will & Emery

[57] ABSTRACT

A semiconductor device includes a p channel MOS transistor with a $p^-$ diffusion region, a $p^+$ diffusion region and a gate electrode formed on the main surface of an $n^-$ layer on a buried oxide film. The $p^-$ diffusion region includes a plurality of branch-like regions to be connected to a $p^+$ diffusion region. A source electrode is formed at the $p^+$ diffusion region. An $n^+$ diffusion region is formed within the $p^+$ diffusion region. A drain electrode is connected to the $p^+$ diffusion region and the $n^+$ diffusion region. According to this structure, the depletion layer between the source electrode and the drain electrode is expanded. A semiconductor device is achieved that is improved in the breakdown voltage at the time of an off operation, or that is improved in on driving current at the time of an on operation with improved breakdown voltage at the time of an off operation.

13 Claims, 20 Drawing Sheets

SEMICONDUCTOR DEVICE

CROSS-REFERENCE TO RELATED APPLICATION

This application is related to copending application of Ser. No. 08/607,033 filed Feb. 26, 1996.

BACKGROUND OF THE INVENTION

1. Field of the Invention

The present invention relates to semiconductor devices, and more particularly, to a semiconductor device that has a current conductive state and a cut off state realized according to the voltage of a gate electrode.

2. Description of the Background Art

A lateral type IGBT (Insulated Gate Bipolar Transistor) will be described hereinafter with reference to the drawings as a first example of a conventional semiconductor device. An IGBT is used for the control of electric motors and the like that require high voltage and high current. FIG. 19 is a perspective view showing such a conventional IGBT in a bird's eye view, and FIG. 20 is a sectional view taken along line XX—XX of FIG. 19.

Referring to FIGS. 19 and 20, a buried oxide 2 film is formed on a semiconductor substrate 1. An $n^-$ layer 3 is formed on buried oxide film 2. A p channel MOS transistor 5 is formed on the surface of $n^-$ layer 3. P channel MOS transistor 5 includes a $p^-$ diffusion region 7, a $p^+$ diffusion region 9, and a gate electrode 11.

An $n^+$ diffusion region 13 is formed adjacent $p^+$ diffusion region 9. An n well 15 is formed so as to surround $p^+$ diffusion region 9 and $n^+$ diffusion region 13. A source electrode 17 is formed so as to be electrically connected to $p^+$ and $n^+$ diffusion regions 9 and 13. Source electrode 17 extends above gate electrode 19 and $p^-$ diffusion region 7 with an oxide film 19 thereunder.

A $p^+$ diffusion region 23 is formed continuously to one end of $p^-$ diffusion region 7. An $n^+$ diffusion region 21 is formed so as to be surrounded by $p^+$ diffusion region 23. A drain electrode 25 is formed electrically connected to $n^+$ diffusion region 21 and $p^+$ diffusion region 23. A substrate electrode (back electrode) 27 is formed at the back side of semiconductor substrate 1.

The operation of IGBT will be described hereinafter. First, an off operation will be described with reference to FIGS. 21 and 22 indicating the state of a depletion layer in an off operation of IGBT in a step manner. Referring to FIGS. 21 and 22, the potential of drain electrode 25 and substrate electrode 27 are 0 V, and a positive potential (+V) is applied to gate electrode 11 and source electrode 17.

As a result, a depletion layer expands from a pn junction J1 at the interface of $p^-$ diffusion region 7 and $n^-$ layer 3, and from a pn junction J2 at the interface between $p^+$ diffusion region 23 and $n^-$ layer 3. The depletion layer expanding from pn junction J1 also expands towards $p^-$ diffusion region 7 as well as toward $n^-$ layer 3 since $p^-$ diffusion region 7 is a region of low concentration. Therefore, $p^-$ diffusion region 7 is also partially depleted. Source electrode 17 formed overlying $p^-$ diffusion region 7 constitutes a field plate. Accordingly, the depletion of $p^-$ diffusion region 7 is promoted to relax the electric field at the neighborhood of gate electrode 11 of pn junction J1.

At the same time, a depletion layer begins to expand from an interface J3 between $n^-$ layer 3 and buried oxide film 2. This expansion of a depletion layer relaxes the electric field at the neighborhood of each pn junction. By further applying a high positive potential, $n^-$ layer 3 and $p^-$ diffusion region 7 are partially depleted. Thus, an off state can be maintained.

An on operation will be described hereinafter with reference to FIG. 23. The potential of gate electrode 11 is set lower than the potential of source electrode 17. This causes the surface of $n^-$ layer 3 right beneath gate electrode 11 to be inverted to the p type to form a channel region. As a result, hole current 28a flows from $p^+$ diffusion region 9 to $p^+$ diffusion region 23 via the channel region and $p^-$ diffusion region 7.

Hole current 28a arriving at $p^+$ diffusion region 23 flows to drain electrode 25 through a pinch resistance area generated at the interface between $n^+$ diffusion region 21 and $p^+$ diffusion region 23. By the voltage drop due to pinch resistance, a potential difference is generated between $n^+$ diffusion region 21 and $p^+$ diffusion region 23. When the hole current increases and the potential difference arrives at a certain level, modulation in conductivity occurs. As a result, electron current 28b begins to flow from $n^+$ diffusion region 21 towards $p^+$ region 7 and $n^+$ layer 3. Thus, an on state is realized.

Another example of a conventional IGBT disclosed in Japanese Patent Laying-Open No. 4-2169 will be described hereinafter. FIG. 24 is a sectional view of this IGBT, and FIG. 25 is a plan view of the neighborhood of the drain electrode shown in FIG. 24.

Referring to FIGS. 24 and 25, an $n^-$ type semiconductor layer 112 is grown epitaxially on a $p^-$ type semiconductor substrate 111. A $p^+$ type buried layer 113 and an isolation region 114 are formed at $n^-$ semiconductor layer 112. A p type base region 115 is formed at a surface portion of $n^-$ type semiconductor layer 112.

An $n^+$ source region 116 is selectively formed at a portion of p type base region 115. A gate electrode 117 is formed at the surface of p type base region 115 sandwiched between $n^+$ source region 116 and $n^-$ semiconductor layer 112 with a gate insulation film 118 thereunder. A source electrode 119 is formed at the surface of $n^+$ source region 116.

An n type buffer region 120 having a continuous curve is spaced apart from p type base region 115 at the surface of $n^-$ type semiconductor layer 112. A $p^+$ type drain region 121 is formed in an n type buffer region 120. $P^+$ type drain region 121 has both side portions conforming to the curve configuration.

$P^+$ type drain region 121 includes parallel regions 121a, 121a. An $n^+$ type contact region 122 is formed between parallel regions 121a, 121a. A drain electrode 123 is formed electrically connected to region 121a and $n^+$ contact region 122.

The operation of this second conventional IGBT will be described hereinafter. By applying a voltage exceeding the threshold value to gate electrode 117, an inversion layer is formed at the surface of p type base region 115. An electron current flows from $n^+$ type source region 116 towards $n^-$ semiconductor layer 112 through this inversion layer.

The electrons flowing to $n^+$ type semiconductor layer 112 flows in n type buffer region 120 establishing low resistance. Since n type buffer region 120 and $p^+$ drain region 121 have a curved configuration, electrons will flow through a distance longer than that of a linear configuration. This means that a greater voltage drop is obtained by a smaller current. As a result, modulation in conductivity occurs even with a relatively low current to maintain the IGBT at an on state.

In the above-described first IGBT, the resistance of $p^-$ diffusion region 7 is the main factor that determines the resistance of the IGBT at the transition to an on operation. It is therefore desirable to reduce the resistance of this p⁻ diffusion region 7 to conduct greater current at an on operation. A general approach to reduce the resistance of p⁻ diffusion region 7 is to increase the p type impurity concentration.

However, increase in the p type impurity region in p⁻ diffusion region 7 will suppress expansion of the depletion layer from pn junction J1 towards p⁻ diffusion region 7. The depletion layer end E at drain electrode 25 side shown in FIG. 22 will be located closer to source electrode 17. This induces the problem that the breakdown voltage between source electrode 17 and drain electrode 25 is reduced.

In an on operation, the hole current flows from p⁺ diffusion region 9 to p⁻ diffusion region 7 through the channel region. The hole current flowing to p⁻ diffusion region 7 passes through p⁺ diffusion region 23 beneath n⁺ diffusion region 21 to arrive at drain region 25. A short-circuit plane 26 to p⁻ diffusion region 7, n⁺ diffusion region 21, and drain electrode 25 has a plane structure shown in FIG. 19 or 26.

Therefore, the hole current flows substantially in a linear manner to short-circuit plane 26 as indicated by arrow 29 in FIG. 29. More specifically, the hole current flows so as to further reduce the voltage drop generated by pinch resistance 30 occurring at the interface of n⁺ diffusion region 21 and p⁺ diffusion region 23, as shown in FIGS. 26 and 27.

A sufficient potential difference between n⁺ diffusion region 21 and p⁺ region 23 cannot be established, so that there is not much electron current flowing from n⁺ diffusion region 21 to p⁺ diffusion region 23. It is therefore difficult to increase the current (on driving current) at an on state.

In the second conventional IGBT, an n-chMOS transistor is applied. A case is considered where a p-chMOS transistor is applied to the IGBT of this structure. It is easily conceived of substituting a p⁻ layer for n⁻ layer 3 to form a predetermined diffusion region. However, it is difficult to form an n type impurity region at a p⁻ layer due to fabrication reasons such as diffusion is extremely time consuming.

Therefore, a predetermined diffusion region is formed respectively at the surface of n⁻ layer 112 as shown in FIG. 28. Particularly, a p type buffer region 220 having a continuous curved configuration is formed spaced apart from n type base region 215. An n⁺ type drain region 221 is formed within p type buffer region 220. N⁺ type drain region 221 includes a parallel region 221a. A p⁺ type contact region 222 is formed at parallel region 221a. The curved p type buffer region 220 is formed closer to the source side so that the p channel has a predetermined length. This means that the distance between the end of the depletion layer expanding from pn junction J4 and the end of the depletion layer expanding from pn junction J5 becomes shorter. This induces the problem that the breakdown voltage of the IGBT is reduced.

To compensate for this problem, an approach is considered of reducing the impurity concentration of the p type buffer region to promote the expansion of the depletion layer to the p type buffer region. However, a problem occurs in which the depletion layer expanding from the p type buffer region comes into contact with the n type drain region to cause punch through. Eventually, the breakdown voltage of the IGBT cannot be improved.

As described above, it was difficult to increase the breakdown voltage in an off operation and also increase the on driving current in an on operation in a conventional IGBT.

SUMMARY OF THE INVENTION

In view of the foregoing, an object of the present invention is to provide a semiconductor device that have breakdown voltage improved in an off operation.

Another object of the present invention is to provide a semiconductor device that has breakdown voltage improved in off operation and current improved in an on operation.

According to an aspect of the present invention, a semiconductor device includes an insulation film formed on a semiconductor substrate, a semiconductor layer, a first impurity region of a second conductivity type, a second impurity region of a first conductivity type, a third impurity region of the first conductivity type, a fourth impurity region of the second conductivity type, a fifth impurity region of the second conductivity type, a first electrode, a second electrode, and a third electrode. The semiconductor layer of the first conductivity type is formed on the insulation film. The first impurity region of the second conductivity type is formed on a main surface of the semiconductor substrate. The second impurity region of the first conductivity type is formed at the main surface of the semiconductor layer, and is surrounded by the first impurity region. The third impurity region of the first conductivity type is formed at the main surface of the semiconductor layer, spaced apart from the first impurity region. The fourth impurity region of the second conductivity type is formed at the main surface of the semiconductor substrate, and surrounded by the third impurity region. The fifth impurity region of the second conductivity type is electrically connected to the first impurity region, and is formed at the semiconductor substrate with a predetermined distance from the fourth impurity region at the main surface. The first electrode is formed at the semiconductor layer sandwiched by the fifth and fourth impurity regions and on the surface of the third impurity region with an insulation film thereunder. The second electrode is electrically connected to the fourth impurity region. The third electrode is electrically connected to the second impurity region, and electrically connected at the short-circuit plane to the first impurity region. The fifth impurity region includes a plurality of branch-like regions. At the main surface, the distance between the leading end of each branch region and the fourth impurity region is constant.

According to the structure of the present aspect, an off operation is carried out by setting the first and second electrodes at the same predetermined potential. In an off operation, a depletion layer expands from the junction plane between the semiconductor layer of the first conductivity type and the first impurity region of the second conductivity type, from the junction plane between the semiconductor layer of the first conductivity type and the branch-like region of the fifth impurity region of the second conductivity type, and from the junction plane between the semiconductor layer of the first conductivity type and the insulation film. Thus, a depletion layer is formed having its end located in the neighborhood of the second electrode side and in the neighborhood of the third electrode side to insulate both electrodes. The semiconductor layer is located between each of the branch-like region of the fifth impurity region. Therefore, the depletion layer expanding towards the semiconductor layer can extend to a position closer to the first impurity region. By this depletion layer, the entire depletion layer expands to the proximity of the first impurity region. As a result, the depletion layer that insulates the second electrode and the third electrode becomes longer to improve the breakdown voltage.

Preferably, each branch-like region is formed towards the third impurity region with the first impurity region as the proximal end. The short-circuit plane is formed in the proximity of the interface between the first and second impurity regions opposite the side where the semiconductor layer between adjacent branch-like regions is located.

According to the above structure, an on operation is effected by setting the first and second electrodes with a predetermined potential difference. In an on operation, an inversion layer of the second conductivity type is formed at the surface of the first conductivity type semiconductor layer beneath the first electrode. A hole current flows from the fourth impurity regions to the fifth impurity region through the inversion layer. The hole current flowing to the fifth impurity region is conducted to the first impurity region to flow to the third electrode at the short-circuit plane.

The hole current flows for a longer distance up to the short-circuit plane formed in the vicinity of the interface between the first impurity region and the second impurity region opposite the side where the semiconductor layer is formed. This causes increase in the pinch resistance generated at the interface between the expansion portion of the second impurity region and the first impurity region to result in a greater voltage drop. The potential difference between the second impurity region and the first impurity region is increased to allow more electron current to flow from the second impurity region to the first impurity region. Thus, the on driving current in an on operation can be improved.

More preferably, the second impurity region includes an expansion portion expanding towards a direction opposite the side where the fifth impurity region is located in the first impurity region excluding the neighborhood of the surface thereof.

According to the above structure, the hole current flows along the expansion portion of the second impurity region in an on operation. As a result, the pinch resistance generated at the interface between the expansion portion of the second impurity region and the first impurity region is increased to allow a greater voltage drop. Thus, the on driving current in an on operation can further be improved.

Further preferably, each of the branch like region is formed so as to diverge from one of the plurality of branch-like regions extending towards the third impurity region with one side of the first impurity region as the proximal end. The short-circuit plane is formed in the proximity of the other side of the first impurity region.

According to the above structure, a hole current flows from the fourth impurity region to the branch-like region of the fifth impurity region via the inversion layer. The hole current flowing through each branch-like region is combined to flow through one branch-like region to arrive at one side of the first impurity region. This hole current arriving at one side of the first impurity region flows through a longer distant towards the short-circuit plane formed at the other side of the first impurity region.

The pinch resistance generated at the interface between the first impurity region and the second impurity region is increased to result in a greater voltage drop. Therefore, more electron current flows from the second impurity region to the first impurity region. As a result, the on driving current can be improved.

More preferably, each branch-like region extends having a component of direction from the first impurity region to the third impurity region.

According to the above structure, a hole current flows from the fourth impurity region to each branch-like region of the fifth impurity region via an inversion layer. The hole current flowing through each branch-like region is combined to hole through one branch-like region to arrive at the first impurity region.

The total distance through which the hole current flows in the fifth impurity region is reduced. As a result, the resistance of the fifth impurity region that does not contribute to the pinch resistance is reduced. Thus, the semiconductor device can be turned on at a lower voltage.

Preferably, the fourth impurity region is formed so as to surround the neighborhood of the leading end of the branch-like region of the fifth impurity region.

According to the above structure, the length of the channel region sandwiched by the fourth impurity region and the portion in the proximity of the leading edge of the branch-like region becomes longer. Therefore, greater hole current can be conducted from the fourth impurity region to the branch-like region in an operation. As a result, the on driving current can be improved.

Further preferably, a sixth impurity region of the second conductivity type that electrically connects respective adjacent branch-like regions is formed between the region at the proximity of each leading edge of adjacent branch-like regions.

According to the above structure, a hole current flows from the fourth impurity region towards the fifth impurity region also passing through the sixth impurity region in an on operation. Therefore, a greater hole current can be conducted, whereby the on driving current can be improved.

Also preferably, each branch-like region is formed having a predetermined width and interval of the following condition. When the width of each branch-like regions is $W_{SD}$ and the interval between adjacent branch-like regions is $W_{SS}$, $W_{SD} \leq 3.0$ μm. Also, α applied as $\alpha = W_{SD}/(WS_D + W_{SS}) \times 100$ satisfies the condition of $75 \leq \alpha < 100\%$.

In this case, a semiconductor device is obtained that has the highest breakdown voltage and on driving current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
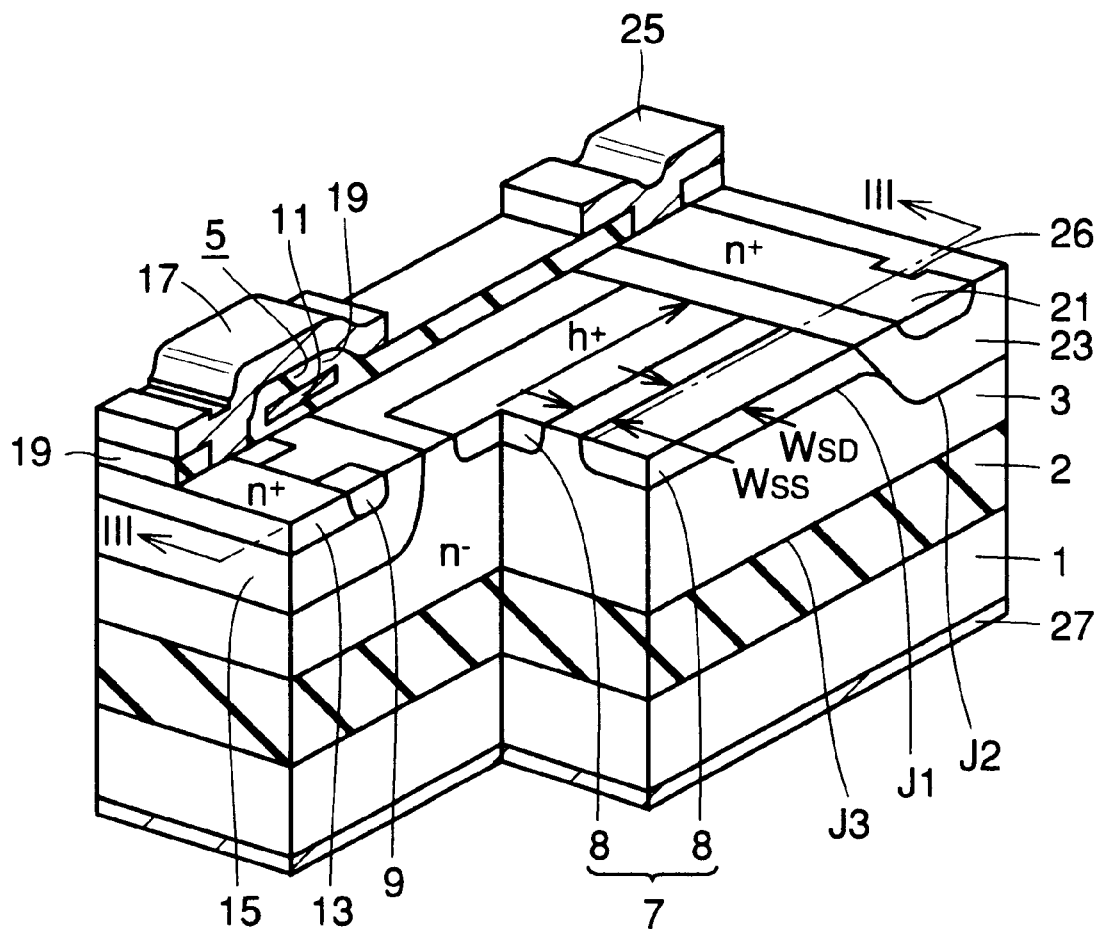
FIG. 1 is a partial perspective cross sectional view of a semiconductor device according to a first embodiment of the present invention.

An IGBT according to a first embodiment of the present invention will be described with reference to the drawings. FIG. 1 is a perspective sectional view of an IGBT. Referring to FIG. 1, a buried oxide film 2 is formed as an insulation film on a semiconductor substrate 1. An n⁻ layer 3 as a semiconductor layer is formed on buried oxide film 2. A p channel MOS transistor 5 is formed at the surface of n⁻ layer 3. P channel MOS transistor 5 includes a p⁻ diffusion region 7 as a fifth impurity region, a p⁺ diffusion region 9 as a fourth impurity region, and a gate electrode 11 as a first electrode.

P⁻ diffusion region 7 includes a plurality of branch-like regions 8. Gate electrode 11 is formed above n⁻ layer 3 sandwiched by one end of branch-like region 8 and p⁺ diffusion region 9 and above the surface of n well 15 with a gate oxide film thereunder. An n⁺ diffusion region 13 is formed adjacent to p⁺ diffusion region 9. An n well 15 serving as a third impurity region is formed so as to surround p⁺ diffusion region 9 and n⁺ diffusion region 13. A source electrode 17 functioning as a second electrode is formed so as to be electrically connected with p⁺ diffusion region 9 and n⁺ diffusion region 13. Source electrode 17 extends over gate electrode 11 and p⁻ diffusion region 7 with an oxide film 19 thereunder.

A p⁺ diffusion region 23 functioning as the first impurity region is formed so as to be electrically connected to the other end of branch-like region 8. An n⁺ diffusion region 21 functioning as the second impurity region is formed surrounded by p⁺ diffusion region 23. A drain electrode 25 functioning as a third electrode is formed electrically connected with p⁺ diffusion region 23 at a short-plane 26, and electrically connected to an n⁺ diffusion region 21. A substrate electrode (back electrode) 27 is formed at the back side of semiconductor substrate 1. The present IGBT has a structure similar to that of the conventional IGBT provided that p⁺ diffusion region 7 has a branch-like region 8.

Although not shown, a multifield plate structure is employed above oxide film 19 between source electrode 17 and drain electrode 25. The multifield plate structure is provided to alleviate the electric field concentration below oxide film 19.

Figure 2:
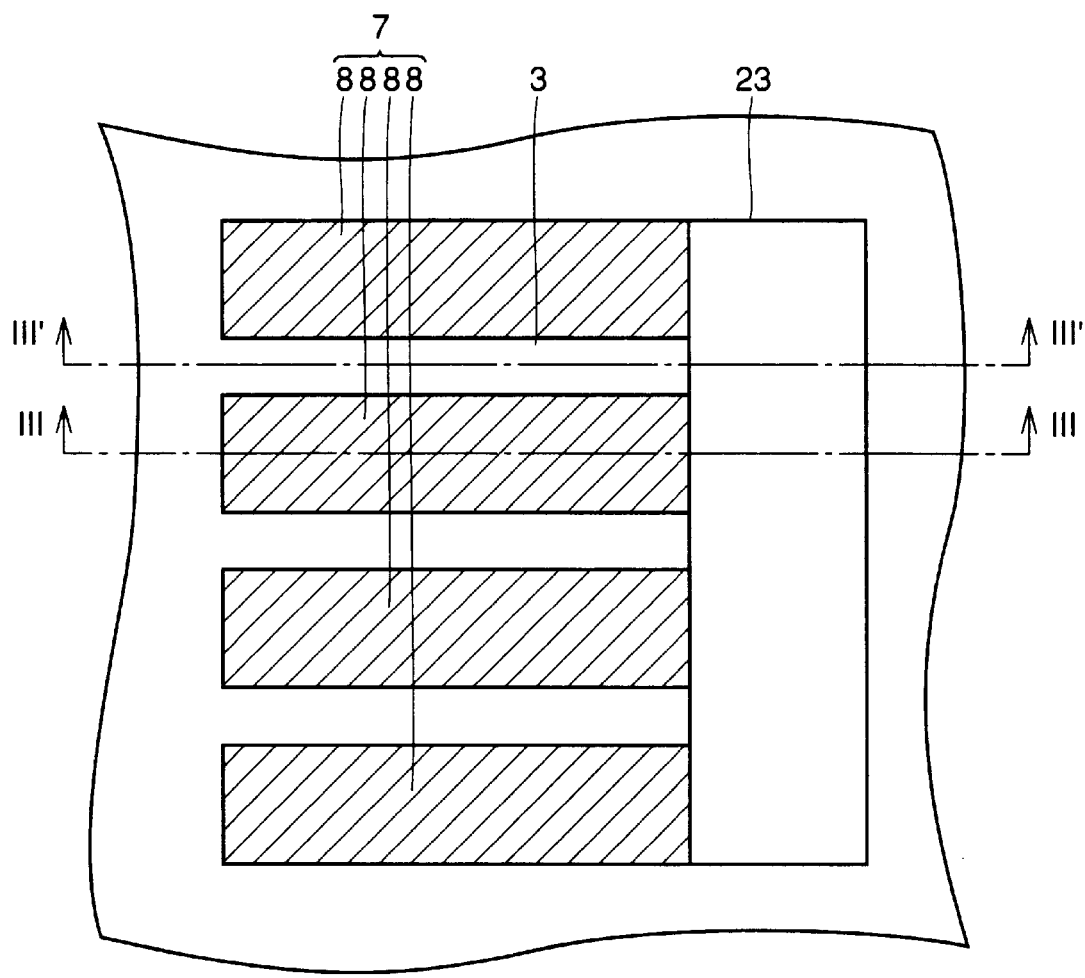
FIG. 2 is a partial plan view of the semiconductor device of FIG. 1.

An off operation in particular will be described hereinafter. FIG. 2 is a plan view of branch-like region 8 of p⁻ diffusion region 7 and p⁺ diffusion region 23 of FIG. 1. Referring to FIGS. 1 and 2, the potential of drain electrode 25 and substrate electrode 27 is set as 0 V. A positive potential is applied to gate electrode 11 and source electrode 17. In response, a depletion layer begins to spread from a pn junction J1 at the interface of p⁻ diffusion region 7 and n⁻ layer 3, from a pn junction J2 at the interface between p⁺ diffusion region 23 and n⁻ layer 3, and from interface J3 between n⁻ layer 3 and buried oxide film 2.

It is particularly noted that a depletion layer spreads from pn junction J1 towards n⁻ layer 3 and p⁻ diffusion region 7. In this case, p⁻ diffusion region 7 has a branch-like region 8 with n⁻ layer 3 present between each branch-like region 8. The depletion layer spreads to the neighborhood of p⁺ diffusion region 23. This causes the entire depletion layer to spread towards the p⁺ diffusion region 23.

Figure 3:
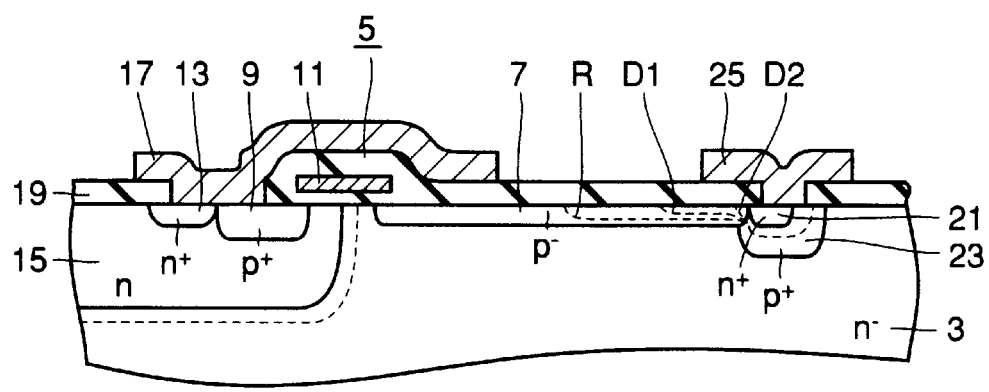
FIG. 3 is a sectional view of a semiconductor device indicating the spread of a depletion layer in the first embodiment.

More specifically, referring to FIGS. 2 and 3, the depletion layer has a profile D2 shown in FIG. 3 at the cross section line of III—III. This causes the depletion layer located at the cross section line of III—III to further spread to p⁺ diffusion region 23 in contrast to the profile R of a conventional IGBT. As a result, the depletion layer indicates a profile D1 shown in FIG. 3. The depletion layer insulating source electrode 17 and drain electrode 25 spreads more than in a conventional IGBT to further improve the breakdown voltage across source electrode 17 and drain electrode 25.

Figure 4:
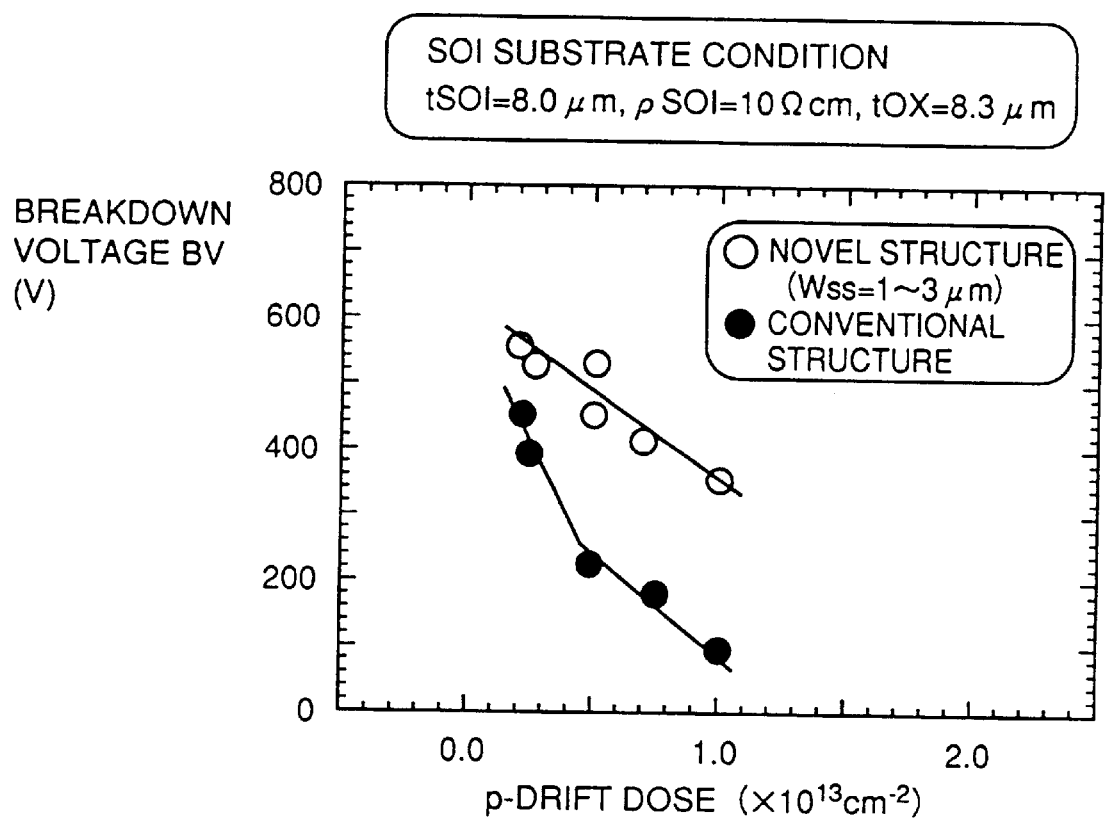
FIG. 4 is a graph showing the evaluation of breakdown voltage according to the first embodiment.

Evaluation of the breakdown voltage for the present IGBT is shown in FIG. 4. In the graph of FIG. 4, the dose of a p type impurity in forming a p⁻ diffusion region is plotted along the abscissa, and the breakdown voltage is plotted along the ordinate. Evaluation was provided for an IGBT including the structure of the present invention and for a conventional IGBT.

It is appreciated that the breakdown voltage is lowered as the impurity concentration of the p⁻ diffusion layer becomes higher in both IGBTs. This is because a higher impurity concentration causes the increase of the depletion layer towards the p⁻ diffusion layer to be suppressed. However, the breakdown voltage of the present IGBT is improved at least 100 v than the conventional IGBT when the impurity concentration of the p⁻ diffusion layer is identical. It is appreciated that the breakdown voltage is improved by at least 250 V when the dose is $1.0 \times 10^{13} \text{cm}^{-2}$.

Second Embodiment

Figure 5:
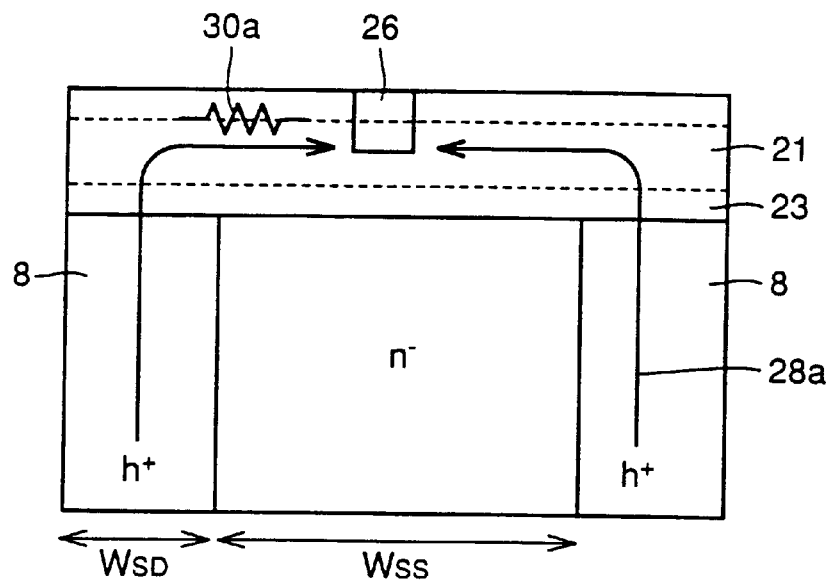
FIG. 5 is a partial plan view of a semiconductor device according to a second embodiment of the present invention.

An IGBT according to a second embodiment of the present invention will be described with reference to the drawings. FIG. 5 is a plan view of the neighborhood of short-circuit plane 26 shown in FIG. 1. Referring to FIGS. 1 and 5, short-circuit plane 26 is formed at the surface of p⁺ diffusion region 23 opposite to n⁻ layer 3 between branch-like regions 8, 8 with an n⁺ diffusion region 21 thereunder.

At short-circuit plane 26, $p^+$ diffusion region 23 is electrically connected with drain electrode 25. The remaining structure is similar to that described in association with the first embodiment. Details will not be repeated.

An on operation in particular will be described hereinafter. Referring to FIGS. 1 and 5, the potential of gate electrode 11 is set lower than the potential of source electrode 17. The surface of n well 15 and $n^-$ layer 3 right beneath gate electrode 11 is inverted to the p type to form a channel region. Accordingly, a hole current 28a flows from $p^+$ diffusion region 9 towards each branch-like region 8 via the channel region.

Hole current 28a flowing through each branch-like region 8 enters $p^+$ diffusion region 23 to flow towards short-circuit plane 26. At this time, the voltage drops by a pinch resistance 30a generated at the interface between $p^+$ diffusion region 23 and $n^+$ diffusion region 21. As a result, the junction potential of $p^+$ diffusion region 23 and $n^+$ diffusion region 21 exceeds a predetermined potential (built-in voltage). Electrons are introduced from $n^+$ diffusion region 21 to $p^+$ diffusion region 23, whereby the IGBT achieves an on operation state.

Figure 6:
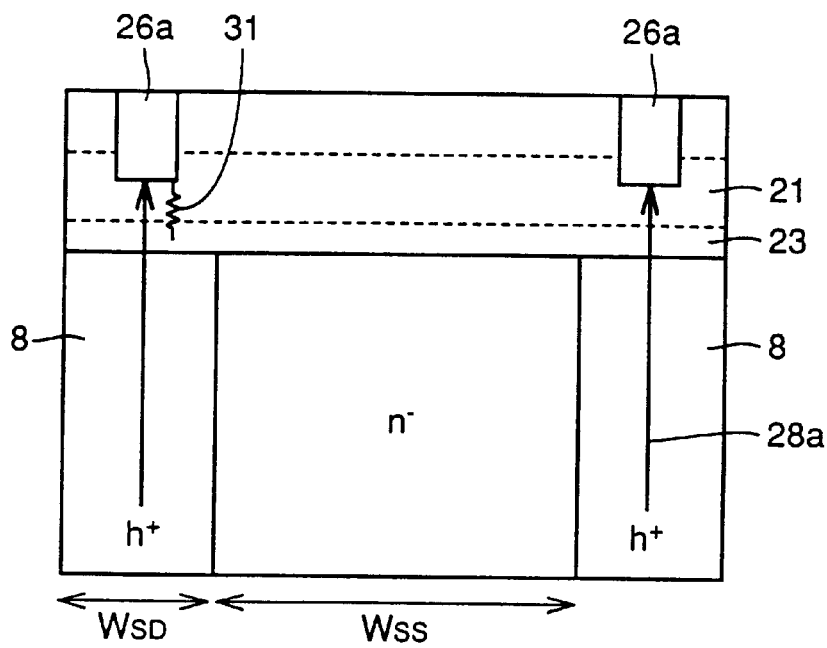
FIG. 6 is a plan view of another semiconductor device for describing the advantage of the semiconductor device of FIG. 5 according to the second embodiment.
Figure 26:
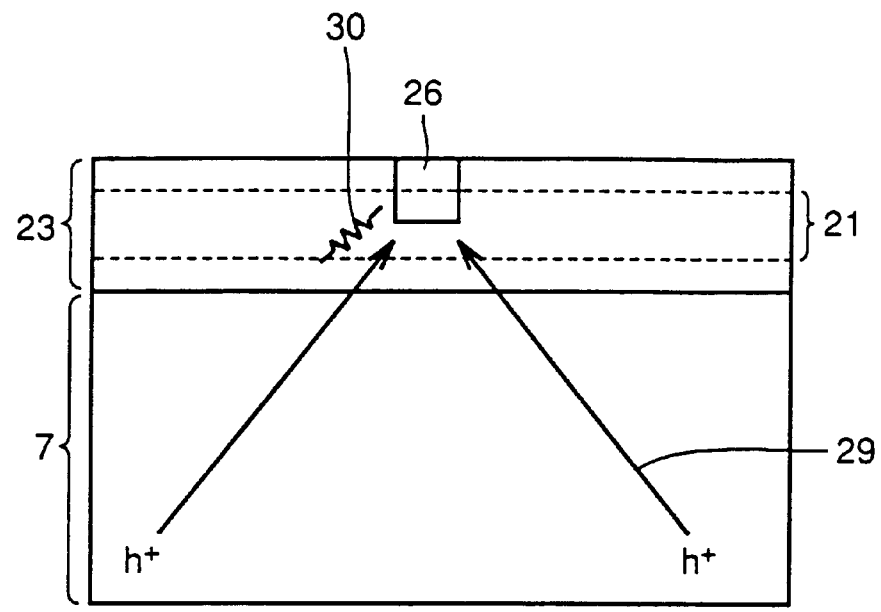
FIG. 26 is a partial plan view for describing problems of a conventional semiconductor device.
Figure 27:
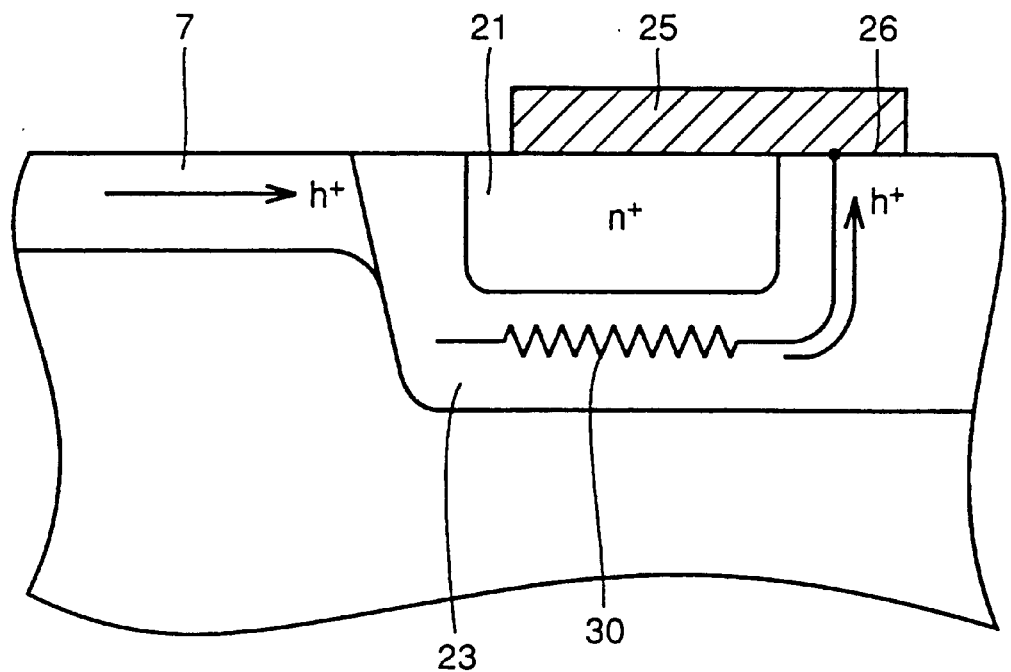
FIG. 27 is a partial sectional view for describing problems of a conventional semiconductor device.
Figure 28:
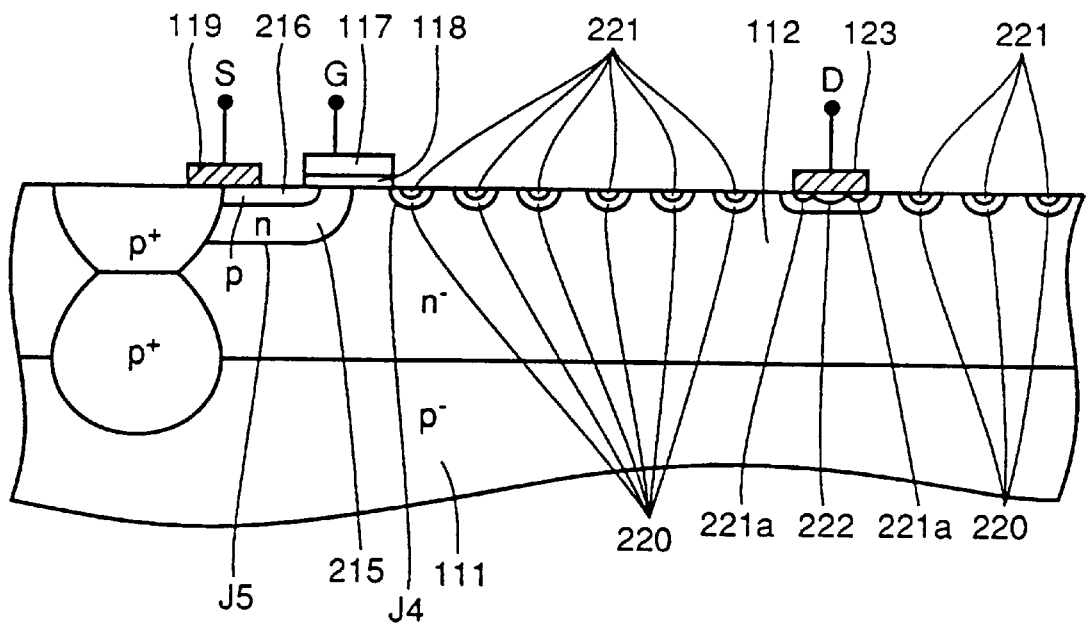
FIG. 28 is a sectional view for describing problems of a conventional semiconductor device.

The advantage of short-circuit plane 26 located at the position shown in FIG. 5 is apparent when comparing with the case where short-circuit plane 26 is located at the position shown in FIG. 6. Specifically, the distance of the hole current entering $p^+$ diffusion region 23 up to short-circuit plane 26 is longer according to the structure of the present invention in comparison to the structure shown in FIG. 26. This means that the voltage drop by pinch resistance 30a is greater than the voltage drop by pinch resistance 31. A greater flow of electrons is introduced from $n^+$ diffusion region 21 to $p^+$ diffusion region 23. Thus, a greater on driving current can be conducted.

Third Embodiment

Figure 7:
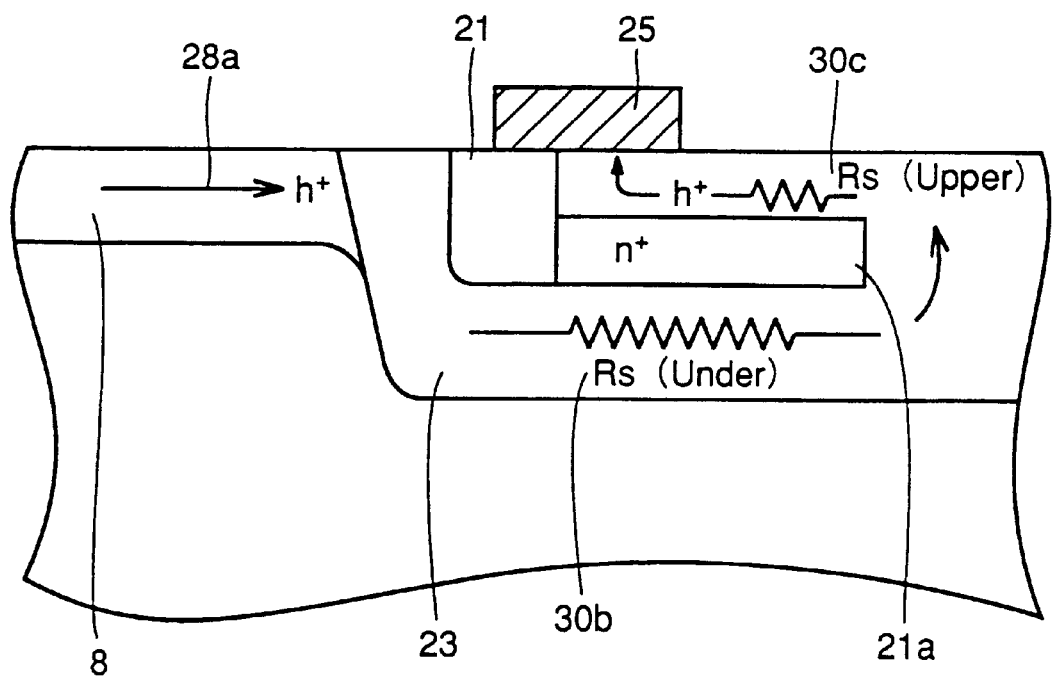
FIG. 7 is a partial sectional view of a semiconductor device according to a third embodiment of the present invention.

An IGBT according to a third embodiment of the present invention will be described with reference to the drawings. In the present IGBT, $n^+$ diffusion region 21 of FIG. 1 has a sectional structure shown in FIG. 7. Referring to FIG. 7, $n^+$ diffusion region 21 includes an expansion portion 21a extending in a direction opposite the direction where branch-like region 8 is located under the surface of $p^+$ diffusion region 23. The remaining structure is identical to that of the first embodiment, and description will not be repeated.

An ON operation of the present IGBT will be described hereinafter. The ON operation is similar to the operation described in the second embodiment. In the IGBT of the present embodiment, hole current 28a from the branch-like region 8 entering $p^+$ diffusion region 23 flows from the neighborhood of the interface between the bottom of expansion 21a and $p^+$ diffusion region 23 along the interface between the top surface of expansion 21a and $p^+$ diffusion region 23. At this time, voltage drop occurs mainly caused by pinch resistances 30b and 30c.

As a result, the junction potential of $n^+$ diffusion region 21 and $p^+$ diffusion region 23 exceeds a predetermined potential. A flow of electrons is conducted from $n^+$ diffusion region 21 to $p^+$ diffusion region 23, whereby the IGBT achieves an on operation. In the present IGBT, a greater voltage drop is achieved by pinch resistance 30c generated at the interface between the upper portion of expansion 21a and $p^+$ diffusion region 23. Thus, an on driving current of a great amount can be conducted.

Fourth Embodiment

Figure 8:
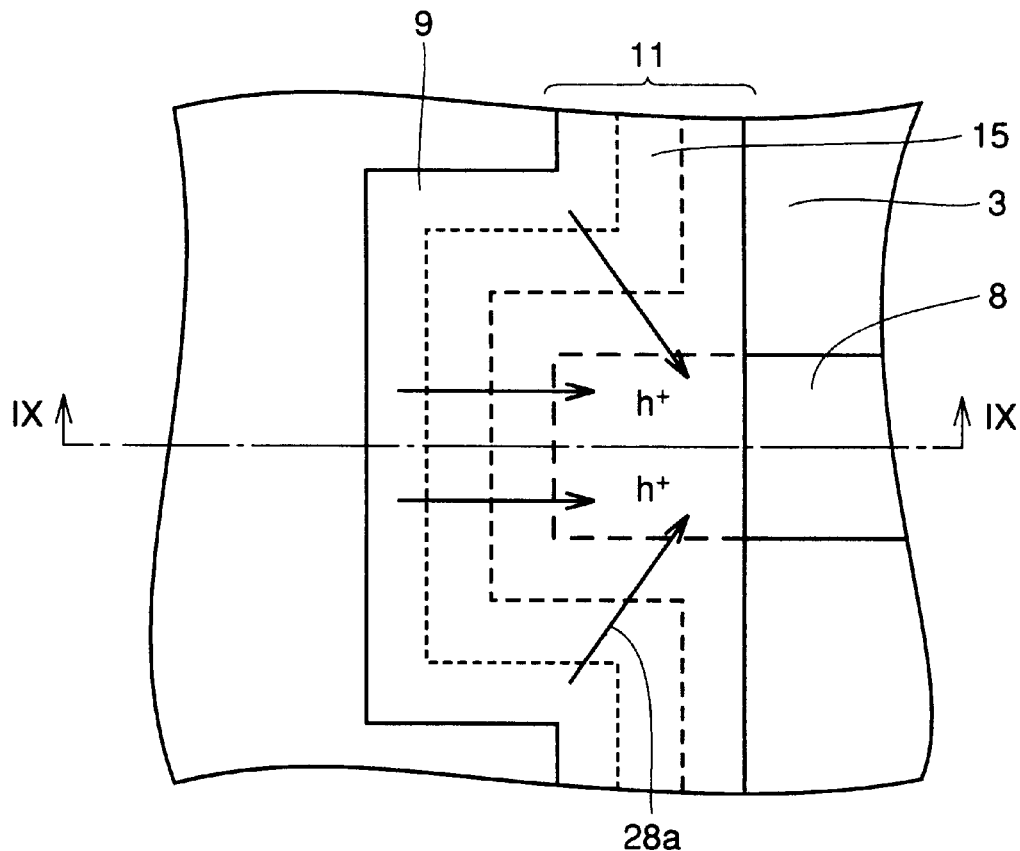
FIG. 8 is a partial plan view of a semiconductor device according to a fourth embodiment of the present invention.
Figure 9:
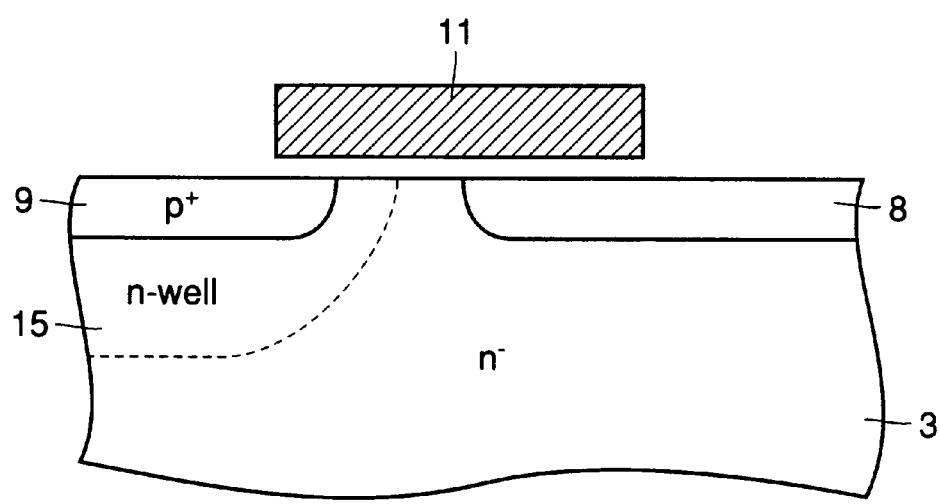
FIG. 9 is a partial sectional view taken along line IX—IX of FIG. 8.

An IGBT according to a fourth embodiment of the present invention will be described with reference to the drawings. In the present IGBT, branch-like region 8 and $p^+$ diffusion region 9 of FIG. 1 have a plane structure shown in FIG. 8. Referring to FIG. 8, $p^+$ diffusion region 9 is formed so as to partially surround the region of the leading edge of branch-like region 8. FIG. 9 shows a cross section taken along line IX—IX of FIG. 8. The remaining structure is similar to the structure described in the first embodiment. Details will not be repeated.

An on operation will be described hereinafter. The on operation is similar to the operation described in the second embodiment. Referring to FIGS. 1 and 8, the potential of gate electrode 11 is set lower than the potential of source electrode 17. A p type channel region is formed at the surface of n well 15 and $n^+$ layer 3 right beneath gate electrode 11. Accordingly, hole current 28a flows from $p^+$ diffusion region 9 to branch-like region 8 via the channel region.

In the present IGBT, $p^+$ diffusion region 9 is formed so as to partially surround the region in the proximity of the leading edge of branch-like region 8. Therefore, the effective gate length (channel width) through which hole current 28a passes becomes longer. Thus, more hole current 28a can be conducted from $p^+$ diffusion region 9 towards branch-like region 8. The hole current flowing to branch-like region 8 flows to $p^+$ diffusion region 23 to reach short-circuit plane 26.

At $p^+$ diffusion region 23, the voltage drops due to pinch resistance. Here, a greater voltage drop is achieved in proportion to a higher value of the hole current. Therefore, the junction potential of $p^+$ diffusion region 23 and $n^+$ diffusion region 21 is increased by conducting more hole current. Thus, a greater driving current can be connected than the case described in the second embodiment.

Fifth Embodiment

Figure 10:
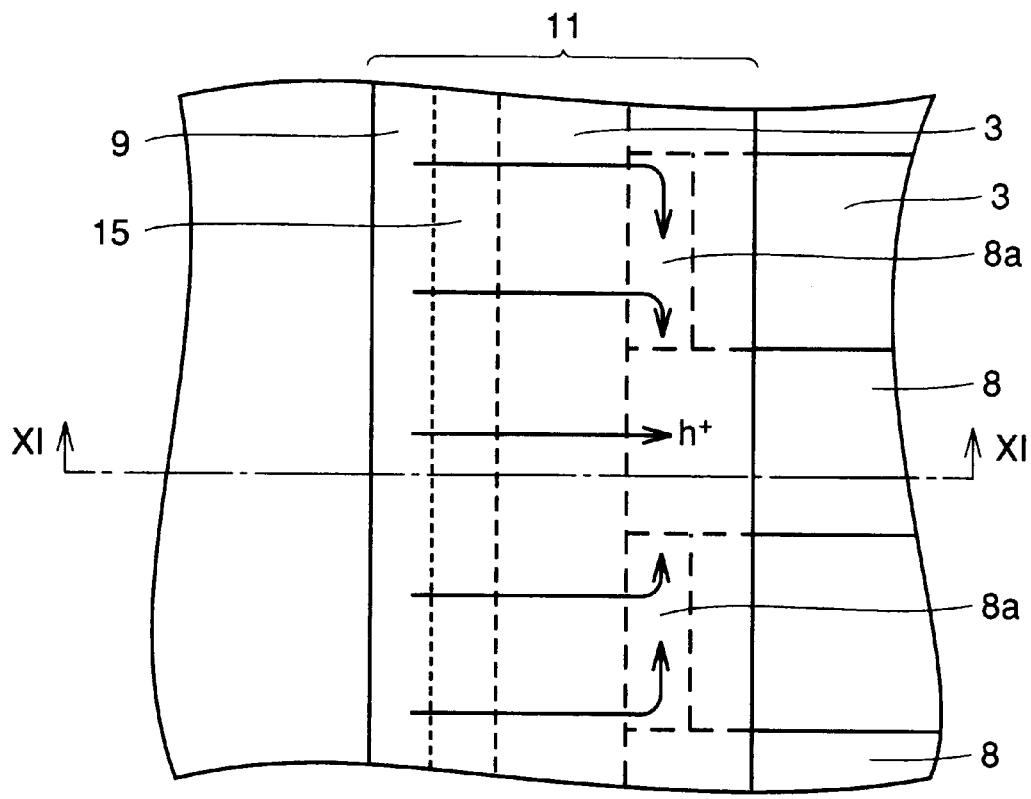
FIG. 10 is a partial plan view of a semiconductor device according to a fifth embodiment of the present invention.
Figure 11:
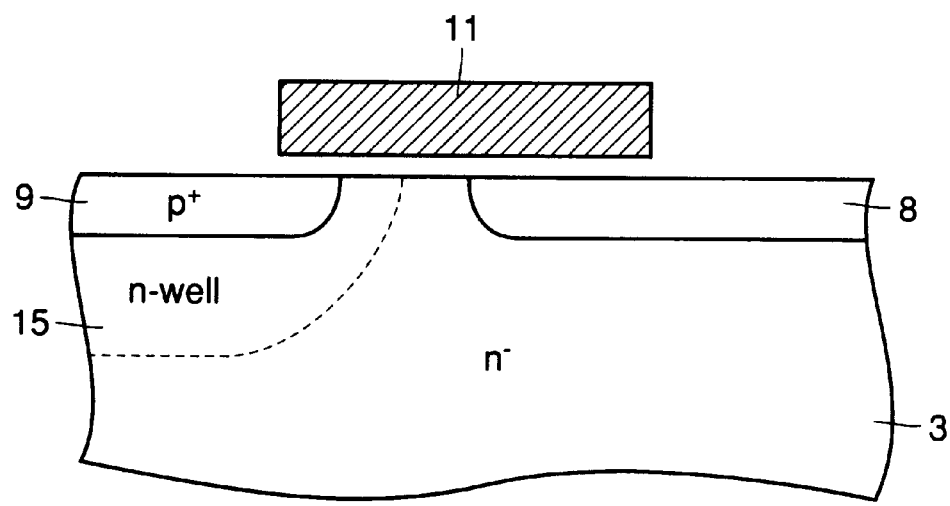
FIG. 11 is a partial sectional view taken along line XI—XI of FIG. 10.

An IGBT according to a fifth embodiment of the present invention will be described with reference to the drawings. In the present IGBT, branch-like region 8 of FIG. 10 has a plane configuration shown in FIG. 10. More specifically, referring to FIG. 10, a $p^-$ transverse region 8a is formed between adjacent branch-like regions 8, 8 at the neighborhood of the leading edge region. According to the present structure, the gate length is further increased than the structure described in the fourth embodiment. FIG. 11 shows a sectional view taken along line IX—IX of FIG. 10. The remaining structure is similar to the structure described in the first embodiment. Details will not be repeated.

An on operation will be described hereinafter. The on operation of the present IGBT is similar to the operation described in the fourth embodiment. Particularly in this case, the gate length (channel length) through which the hole current flows is longer than that of the fourth embodiment. Therefore, a further greater hole current is conducted. Thus, the on driving current can further be improved.

Sixth Embodiment

Figure 12:
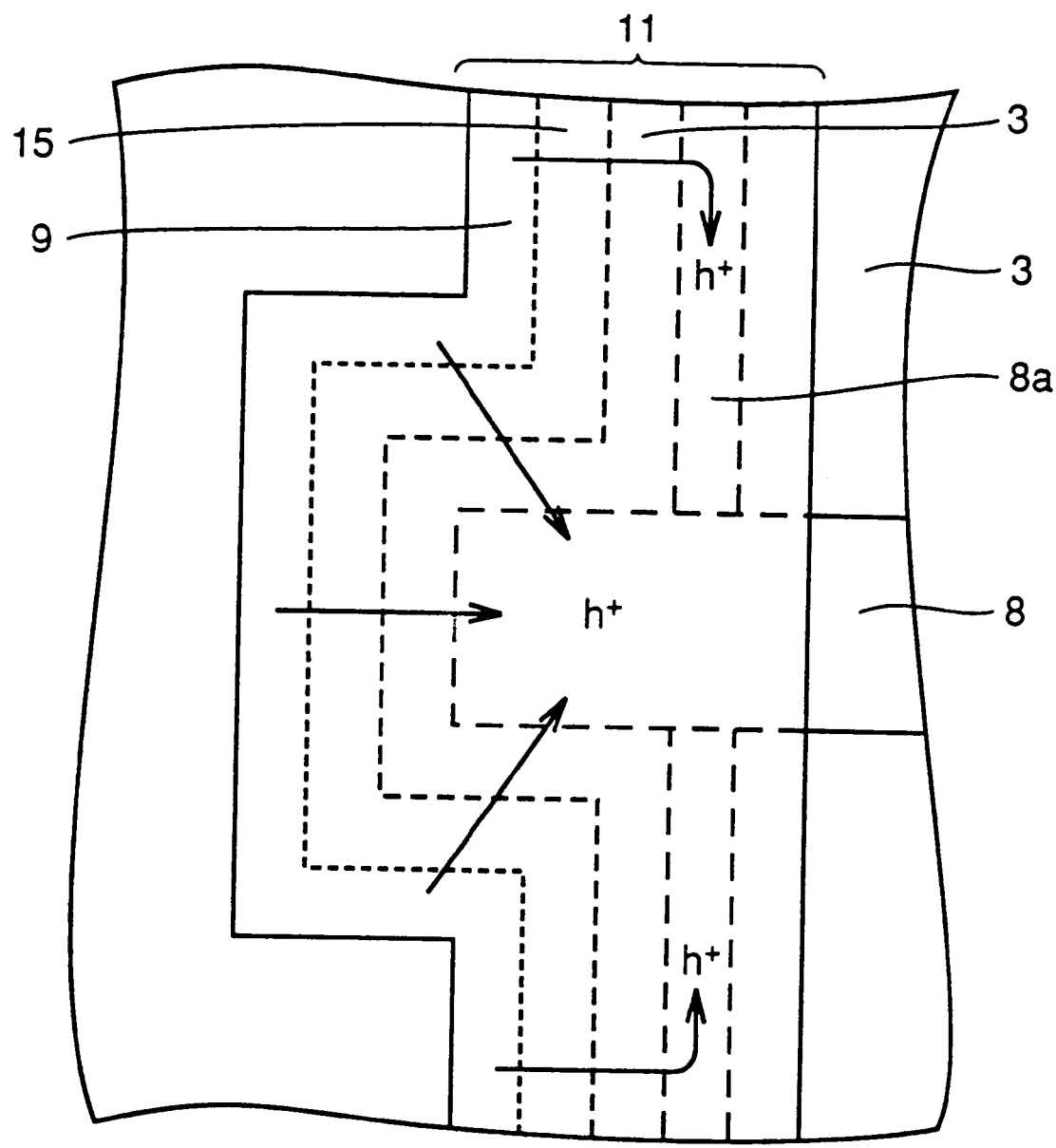
FIGS. 12, 13 and 14 are partial plan views of a semiconductor device according to sixth, seventh and eighth embodiments, respectively, of the present invention.

An IGBT according to a sixth embodiment of the present invention will be described with reference to the drawings. In the present IGBT, branch-like region 8 and $p^+$ diffusion region 9 has a plane structure of FIG. 12 which is a combination of the plane structure described in the fourth and fifth embodiments. In the present embodiment, the gate length is longer than that of the structure described in the fifth embodiment. Therefore, the on driving current can further be improved, as described above.

Seventh Embodiment

Figure 13:
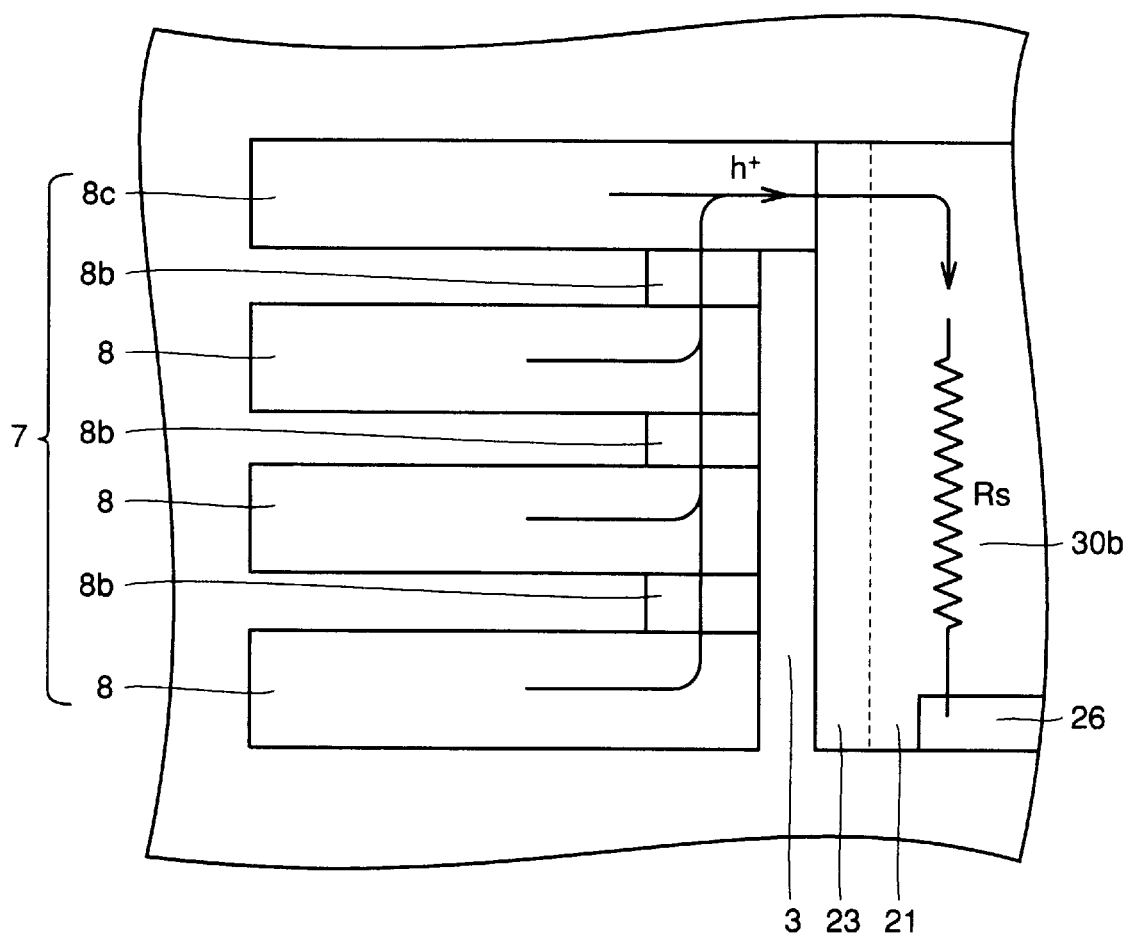

An IGBT according to a seventh embodiment of the present invention will be described with reference to the drawings. In the present IGBT, p⁻ diffusion region 7 of FIG. 1 has a plane structure shown in FIG. 13. Referring to FIG. 13, each branch-like region 8 of p⁻ diffusion region 7 is electrically connected to an adjacent branch-like region by a p⁻ transverse region 8b just prior to being electrically connected to p⁺ diffusion region 23. Each branch-like region 8 is electrically connected to branch-like region 8c that is electrically connected to p⁺ diffusion region 23.

More specifically, p⁻ diffusion region 7 has a configuration in which one branch-like region extending from p⁺ diffusion region 23 out of the plurality of branch-like regions is further branched. Branch-like region 8c is electrically connected at one side of p⁺ diffusion region 23. Short-circuit plane 26 is formed at the other side of p⁺ diffusion region 23. The remaining structure is similar to the structure described with reference to FIG. 1. Details thereof will not be repeated.

An on operation will be described hereinafter. The on operation of the present IGBT is similar to the operation described in the second embodiment. Referring to FIGS. 1 and 13, a hole current flows from p⁺ diffusion region 9 to each branch-like region 8 via the channel region by applying a predetermined potential to gate electrode 11 and source electrode 17. The hole current flowing through each branch-like region 8 reaches p⁺ diffusion region 23 through p⁻ transverse region 8b and branch-like region 8c. The hole current further passes through p⁺ diffusion region 23 to arrive at short-circuit plane 26.

At this time, the hole current flows from one side to the other side of p⁺ diffusion region 23. During this flow, a greater voltage drop occurs by pinch resistance 30b. As a result, the on driving current can be improved as described in the second embodiment. Since it is not necessary to newly form a pinch resistance to achieve a greater voltage drop in the present IGBT, the on driving current can be improved without increasing the area of the device.

Eighth Embodiment

An IGBT according to an eighth embodiment of the present invention will be described with reference to the drawings. In the present IGBT, p⁻ diffusion region 7 of FIG. 1 has a plane structure shown in FIG. 14. More specifically, referring to FIG. 14, each branch-like region 8 is electrically connected sequentially to an adjacent branch-like region 8 by a p⁻ transverse region 8b to be electrically connected to p⁺ diffusion region 23 at one side. More specifically, p⁻ diffusion region 7 has a configuration in which one branch-like region extending from p⁺ diffusion region 23 among the plurality of branch-like regions 8 is further branched. Also, each branch-like region extends having a directional component from p⁺ diffusion region 23 to n well 15. Short-circuit plane 26 is located at the other side of p⁺ diffusion region 23. The remaining structure is similar to the structure described in the first embodiment. Details thereof will not be repeated.

An on operation of the present IGBT will be described. The on operation is similar to the operation described in the seventh embodiment. The hole current flowing into each branch-like region 8 arrives at p⁺ diffusion region 23. In contrast to the structure of the seventh embodiment, the total distance of the hole current flow from each branchlike region 8 to p⁺ diffusion region 23 is shorter in the present IGBT. Therefore, the resistance component is reduced in all regions except for the region contributing to the pinch resistance such as p⁺ diffusion region 23. Thus, the IGBT can achieve an on operation at a lower voltage.

Figure 14:
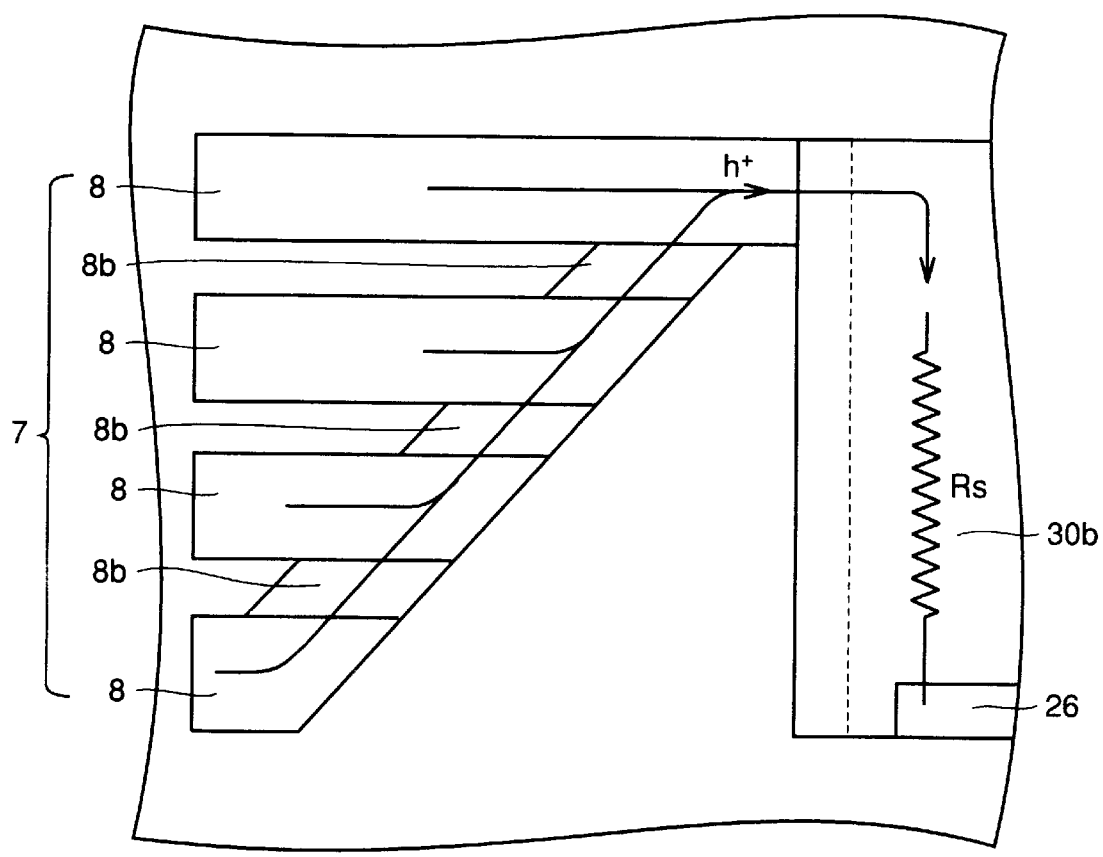

Comparing the structures shown in FIGS. 13 and 14, the structure of FIG. 14 has a larger area of n⁻ layer 3 exposed. Therefore, the contact area between each branch-like region 8 and n⁻ layer 3 is reduced to facilitate the spread of the depletion layer in an off operation. Thus, the breakdown voltage of the IGBT can further be improved.

Ninth Embodiment

The result of the assessment of the IGBT shown in FIG. 1 will be described as the ninth embodiment. As the first assessment, the relationship between the width of the branch-like region and on driving current is provided. Two types of IGBTs are used for assessment, having the values of 50% and 75% for a given by the equation of:

$$\alpha = W_{SD}/(W_{SD} + W_{SS}) \times 100(\%)$$

where $W_{SD}$ is the width of a branch-like region, and $W_{SS}$ is the distance between adjacent branch-like regions shown in FIG. 1. Here, values in the range of 3–18 μm are employed for $W_{SD}$. An SOI (Silicon On Insulator) substrate is used as n⁻ layer 3. The SOI substrate was set to 8.0 μm in thickness and 10 Ωcm in resistivity. The thickness of the buried oxide film is set to 8.3 μm. The dose in forming a p⁻ diffusion region is set to $7.0 \times 10^{12}$ cm⁻².

A conventional IGBT with 100% as the value of α, i.e. the first conventional IGBT described in the section of the background art is used. For the purpose of obtaining the highest on driving current as the target level for the current value, a structure that does not have the short-circuit plane located right beneath the drain electrode is used.

Figure 15:
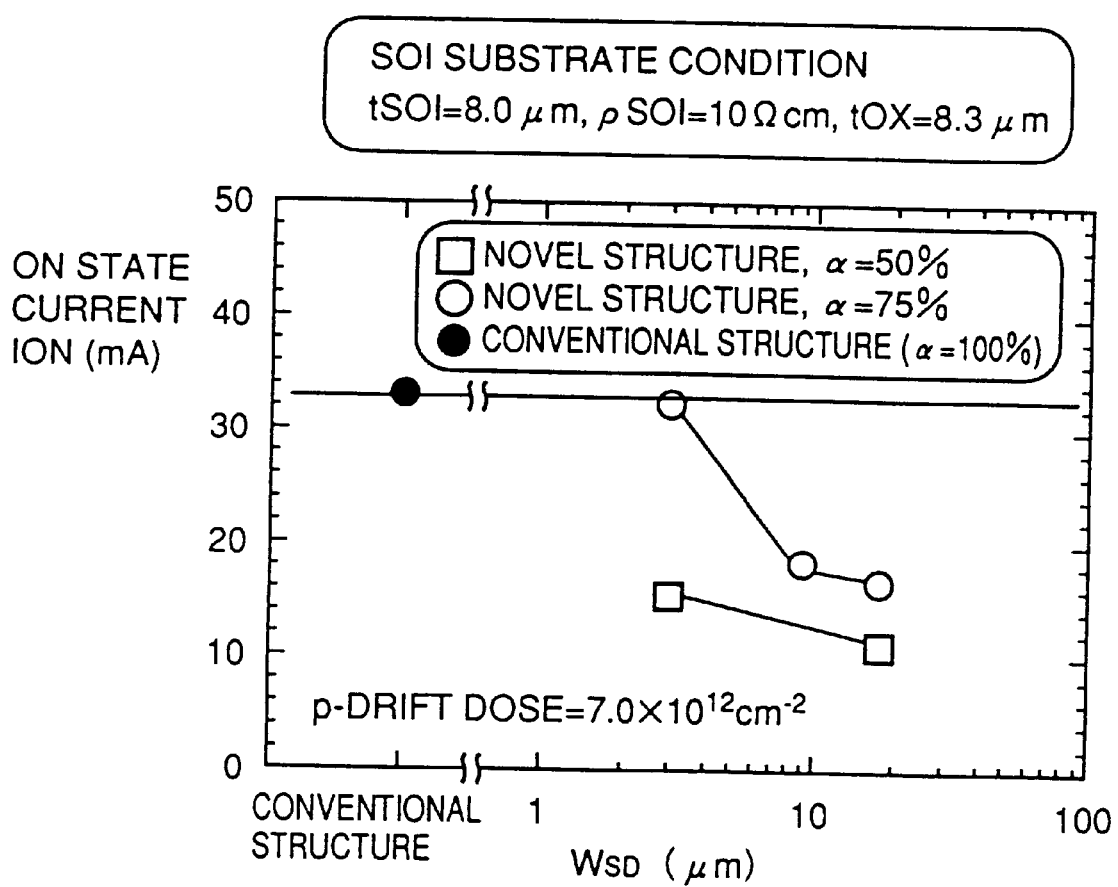
FIGS. 15 and 16 are graphs showing first and second assessment results of the semiconductor device according to a ninth embodiment of the present invention.

The assessment result is shown in FIG. 15. The on driving current is defined by the drain driving current when Vg=Vd=−5.0 V is set where Vg is the potential of gate electrode 11 and Vd is the potential of drain electrode 25. It is appreciated from FIG. 15 that the on driving current increases as the value of $W_{SD}$ becomes smaller even when the value of α is constant. An on driving current approximating the target level can be obtained when a =75% and $W_{SD}$=3.0 μm. The reason why the on driving current increases with a smaller value of $W_{SD}$ may be due to a longer distance corresponding to pinch resistance 30a shown in FIG. 5, for example. It is considered that the voltage drop is increased by pinch resistance 30a to result in a greater on driving current. From the result, width $W_{SD}$ is desirably not more than 3.0 μm. Furthermore, it is found that the value of α is at least 75% and less than 100%.

Figure 16:
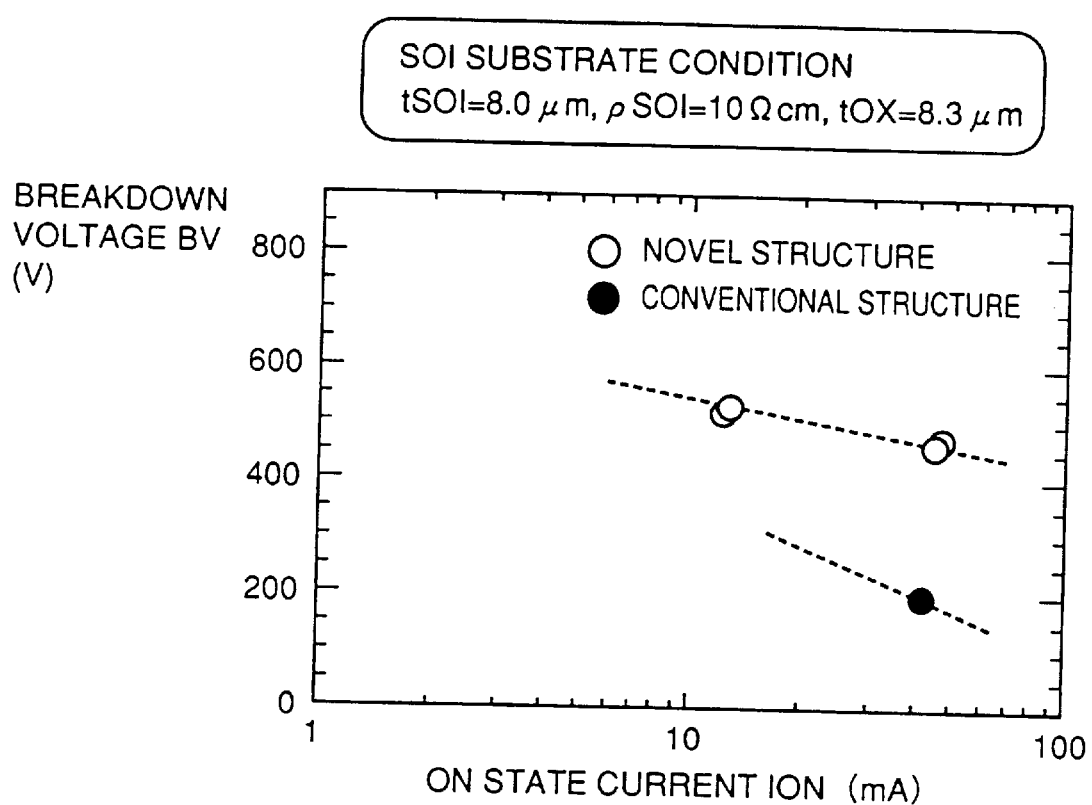

As a second assessment, the relationship between the on driving current and breakdown voltage is provided. The assessment result is shown in FIG. 16. It is appreciated from FIG. 16 that the breakdown voltage is improved by at least 300 V in the present IGBT with respect to the on driving current of a level substantially equal to that of the IGBT of the conventional structure.

Tenth Embodiment

In the above first to ninth embodiments, description is provided of an IGBT for a semiconductor device. The structure of the present invention can also be applied to a power device such as a BRT (Base Resistance Thyristor) and EST (Emitter Switched Thyristor). To begin with, a BRT will be described as a semiconductor device according to a tenth embodiment of the present invention with reference to the drawings.

Figure 17A:
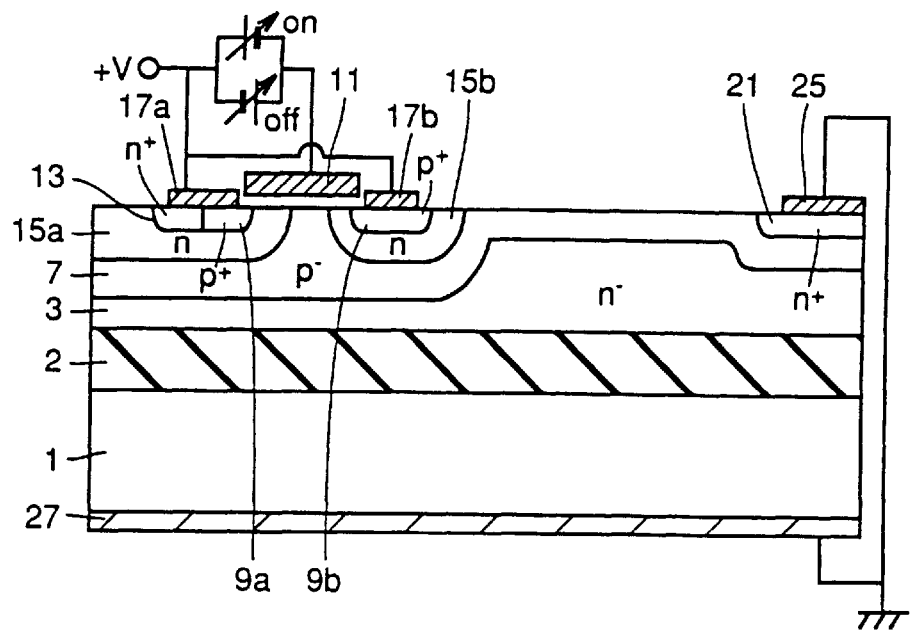
FIGS. 17A and 17B are sectional views of a first semiconductor device according to a tenth embodiment of the present invention taken along respective cross sections.

Referring to FIG. 17A, an n⁻ layer 3 is formed on a semiconductor substrate 1 with a buried oxide film 2 thereunder. A p⁻ diffusion region 7 is formed at the surface of n⁻ layer 3. N wells 15a, 15b and n⁺ diffusion region 21 spaced apart are provided at the surface of p⁻ diffusion region 7. An n⁺ diffusion region 13 and a p⁺ diffusion region 9a are respectively formed at the surface of n well 15a.

A source electrode 17a is formed so as to come into contact with both n⁺ diffusion region 13 and p⁺ diffusion region 9a. A source electrode 17b is formed in contact with p⁺ diffusion region 9b. Above the surface of n wells 15a, 15b and p⁻ diffusion region 7 located between n wells 15a and 15b, a gate electrode 11 is formed with an oxide film 10 thereunder. Also, a drain electrode 25 is formed in contact with the surface of n⁺ diffusion region 21.

Figure 17B:
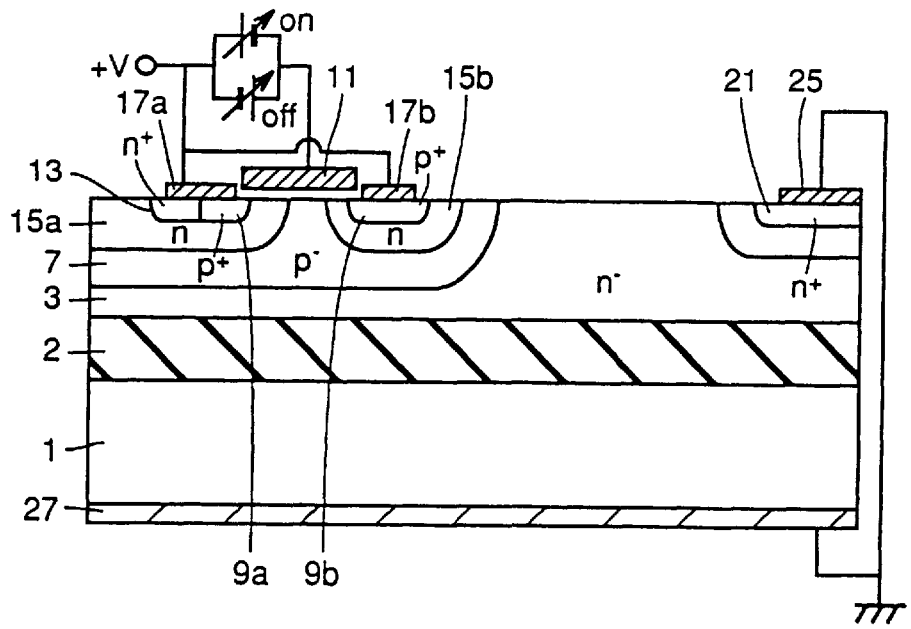

According to the above structure, p⁻ diffusion region 7 located between n well 15b and n⁺ diffusion region 21 forms a branch-like region. N⁻ layer 3 is provided between branch-like regions. The BRT has a sectional structure shown in FIG. 17B.

In the above-described structure, expansion of a depletion layer from the junction plane of n⁻ layer 3 and p⁻ diffusion region 7 towards n⁻ layer 3 is promoted particularly in an off operation. Thus, the breakdown voltage of the BRT can be improved.

Figure 18:
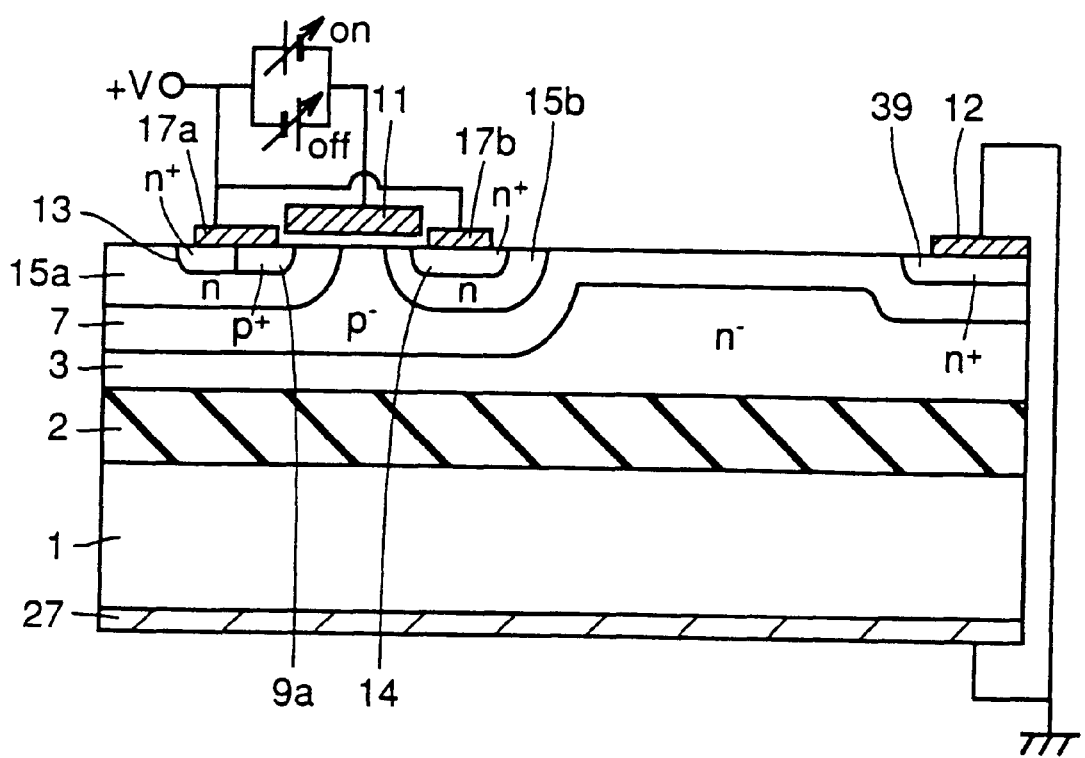
FIG. 18 is a sectional view of a second semiconductor device according to the tenth embodiment of the present invention.
Figure 19:
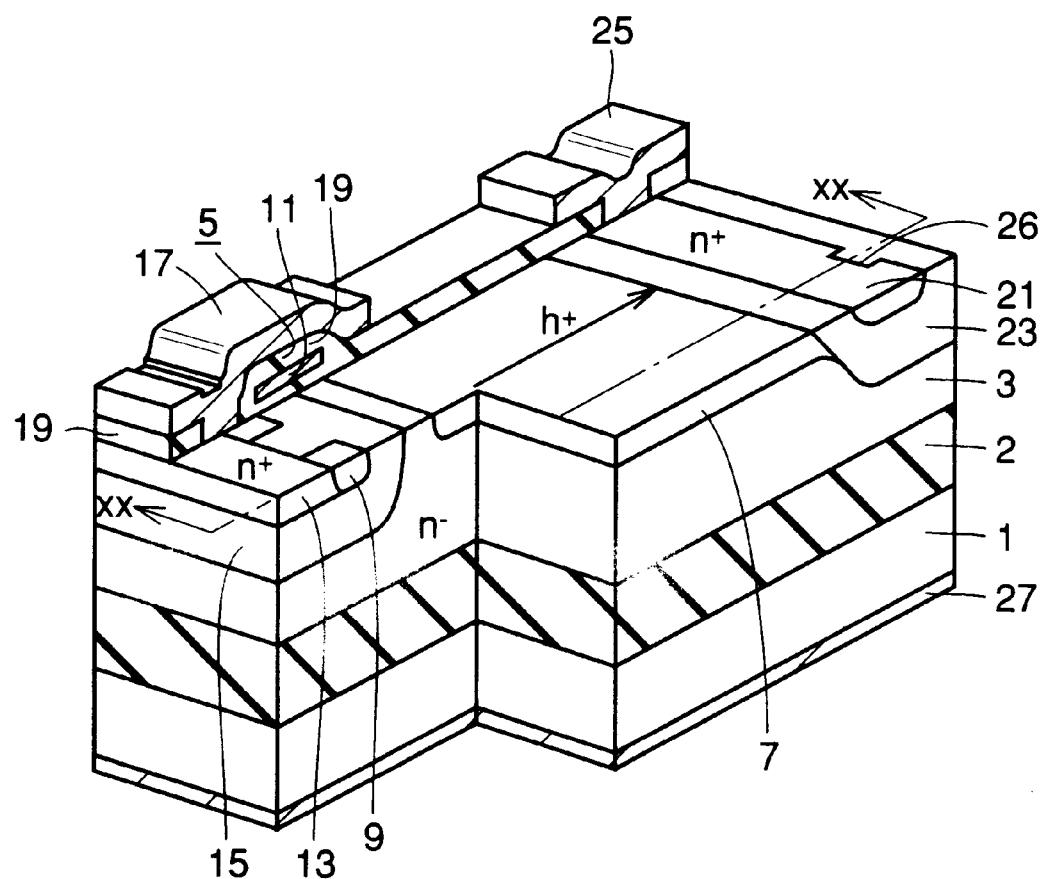
FIG. 19 is a perspective cross sectional view showing a first conventional semiconductor device.
Figure 20:
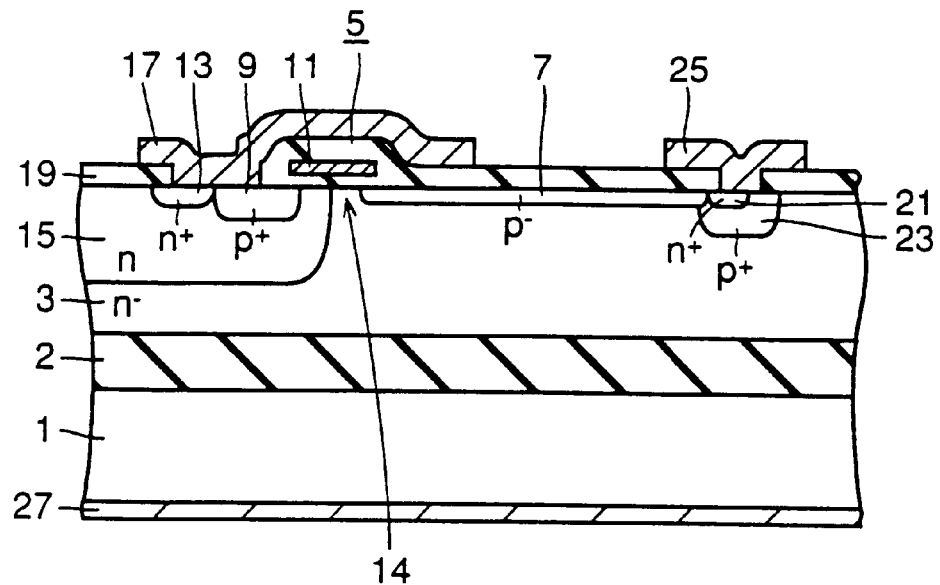
FIG. 20 is a sectional view taken along line XX—XX of the semiconductor device of FIG. 19.
Figure 21:
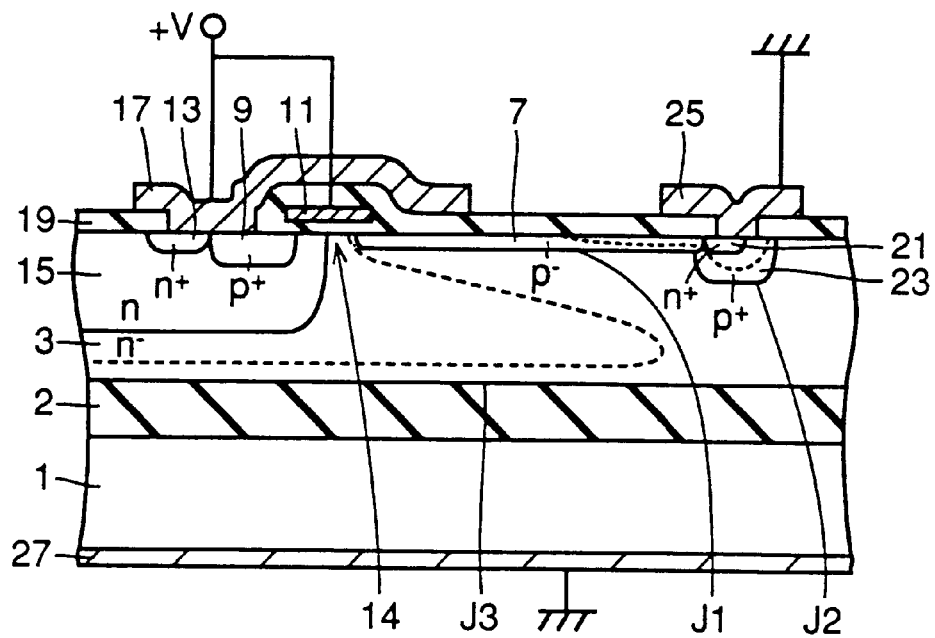
FIGS. 21 and 22 are cross sectional views of the semiconductor device of FIG. 19 for describing an off operation.
Figure 22:
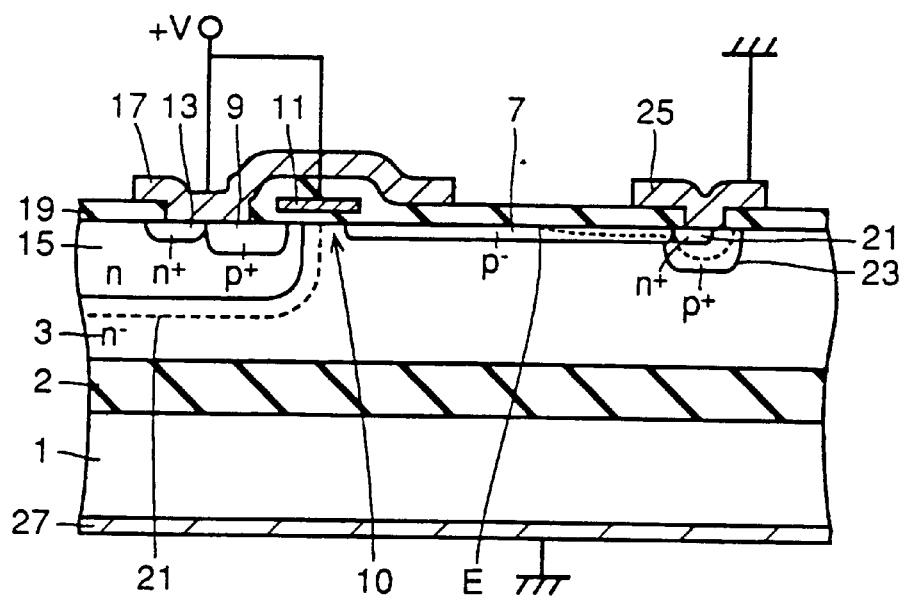
Figure 23:
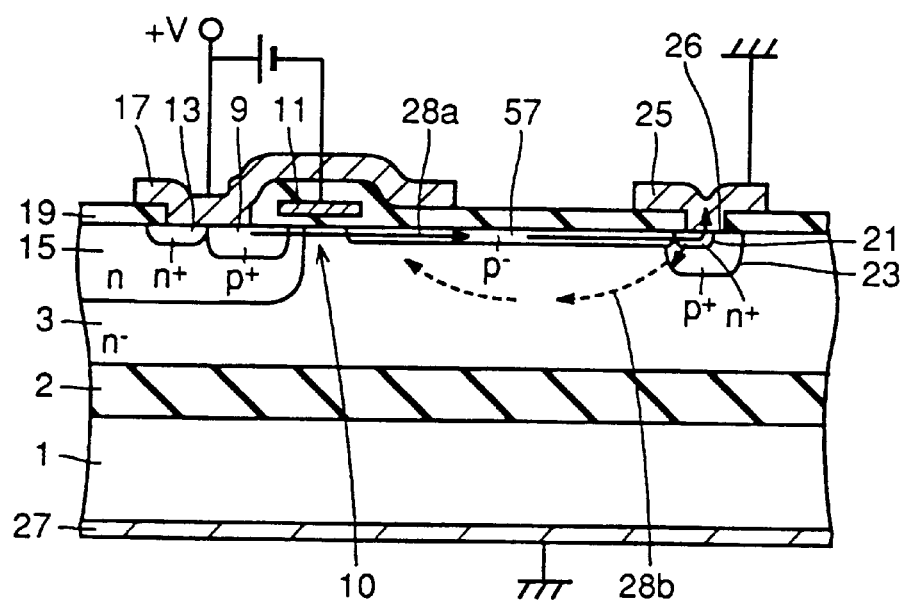
FIG. 23 is a sectional view of the semiconductor device of FIG. 19 for describing an on operation.
Figure 24:
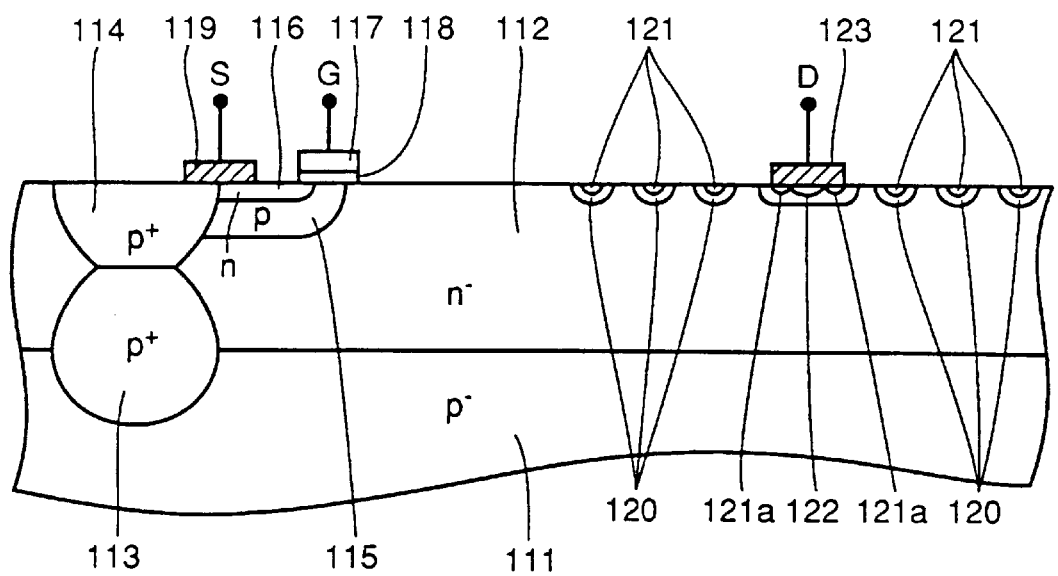
FIG. 24 is a sectional view of a second conventional semiconductor device.
Figure 25:
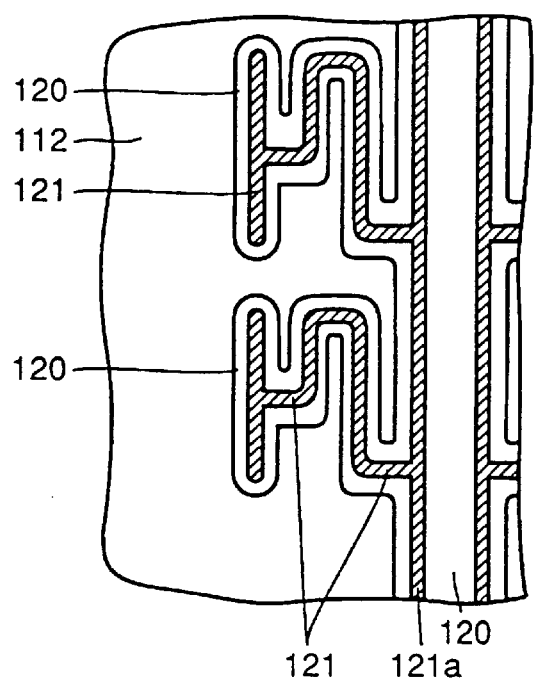
FIG. 25 is a partial plan view of the semiconductor device of FIG. 24.

An EST will be described with reference to FIG. 18. The structure of EST is similar to the structure of BRT provided that p⁺ diffusion region 9b shown in FIG. 17A is replaced with an n⁺ diffusion region 14. Therefore, the breakdown voltage can be improved in an EST, similar to a BRT.

In the IGBT and the like described in the above embodiments, a p-chMOS transistor is provided as an MOS transistor. However, the same advantage can be achieved by forming an n-chMOS transistor by inverting the conductivity type of each diffusion region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an insulation film formed on a semiconductor substrate,
   a semiconductor layer of a first conductivity type formed on said insulation film,
   a first impurity region of a second conductivity type formed at a main surface of said semiconductor layer,
   a second impurity region of the first conductivity type formed at the main surface of said semiconductor layer, and surrounded by said first impurity region,
   a third impurity region of the first conductivity type formed at the main surface of said semiconductor layer, and spaced apart from said first impurity region,
   a fourth impurity region of the second conductivity type formed at the main surface of said semiconductor layer, and surrounded by said third impurity region,
   a fifth impurity region of the second conductivity type electrically connected to said first impurity region, and formed at said semiconductor layer with a predetermined distance from said fourth impurity region at the main surface,
   a first electrode formed on a surface of said semiconductor layer and said third impurity region sandwiched by said fifth impurity region and said fourth impurity region, with an insulation film thereunder,
   a second electrode electrically connected to said fourth impurity region, and
   a third electrode electrically connected to said second impurity region, and electrically connected to said first impurity region at a short-circuit plane, wherein said fifth impurity region includes a plurality of branch-like regions electrically connected to the first impurity region and extending from the first impurity region towards the fourth impurity region, and the leading end portions of the branch-like regions are located apart from each other with no region electrically connecting the leading end portions of the branch-like regions, and the leading end portion of each branch-like region and the fourth impurity region are arranged with a distance therebetween, and
   wherein a distance between a leading end portion of each said branch-like region and said fourth impurity region is said predetermined distance at said main surface.

2. The semiconductor device according to claim 1, wherein said short-circuit plane is formed in a neighborhood of an interface of said first impurity region and said second impurity region at a side located opposite to said semiconductor layer between adjacent said branch-like regions.

3. The semiconductor device according to claim 2, wherein said second impurity region includes an expansion portion extending in a direction away from said fifth impurity region.

4. The semiconductor device according to claim 3, wherein said fourth impurity region is formed so as to surround each leading end portion of each said branch-like region of said fifth impurity region.

5. The semiconductor device according to claim 2, wherein said fourth impurity region is formed so as to surround each leading end portion of each said branch-like region of said fifth impurity region.

6. The semiconductor device according to claim 2, wherein each said branch-like region is formed having a predetermined width and a distance, with $$W_{SD} \leq 3.0 \, \mu m$$

and $$75\% \leq \alpha < 100\%$$

where $$\alpha = W_{SD}/(W_{SD}+W_{SS}) \times 100(\%)$$

and $W_{SD}$ is the width of each said branch-like region and $W_{SS}$ is the distance between adjacent branch-like regions.

7. The semiconductor device according to claim 1, wherein each said branch like region extends towards said third impurity region with one side of said first impurity region as a proximal end,
   wherein said short-circuit plane is formed in a neighborhood of the other side of said first impurity region.

8. The semiconductor device according to claim 7, wherein said each branch-like region extends from said first impurity region towards said third impurity region.

9. The semiconductor device according to claim 8, wherein said fourth impurity region is formed so as to surround a leading edge region of each said branch-like region of said fifth impurity region.

10. The semiconductor device according to claim 7, wherein said fourth impurity region is formed so as to surround a leading edge region of said branch-like region of said fifth impurity region.

11. The semiconductor device according to claim 7, wherein each said branch-like regions is formed having a predetermined width and a distance, with $$W_{SD} \leq 3.0 \, \mu m$$

and $$75\% \leq \alpha < 100\%$$

where $$\alpha = W_{SD}/(W_{SD}+W_{SS}) \times 100(\%)$$

and $W_{SD}$ is the width of each said branch-like region and $W_{SS}$ is the distance between adjacent branch-like regions.

12. The semiconductor device according to claim 1, wherein said fourth impurity region is formed so as to surround a leading edge region of each said branch-like region of said fifth impurity region.

13. The semiconductor device according to claim 1, wherein each said branch-like region is formed having a predetermined width and a distance, with $$W_{SD} \leq 3.0 \, \mu m$$

and $$75\% \leq \alpha < 100\%$$

where $$\alpha = W_{SD}/(W_{SD}+W_{SS}) \times 100(\%)$$

and $W_{SD}$ is the width of each said branch-like regions and $W_{SS}$ is the distance between adjacent branch-like regions.

* * * * *

UNITED STATES PATENT AND TRADEMARK OFFICE
CERTIFICATE OF CORRECTION

PATENT NO. : 6,049,095
DATED : April 11, 2000
INVENTOR(S) : HAJIME AKIYAMA

It is certified that error appears in the above-identified patent and that said Letter Patent is hereby corrected as shown below:

Column 10, Line 43, change "IX-IX" to --XI-XI--.

Signed and Sealed this

Seventeenth Day of April, 2001

NICHOLAS P. GODICI

*Attest:*

*Attesting Officer*     Acting Director of the United States Patent and Trademark Office